(12) United States Patent
Wagner et al.

(10) Patent No.: US 6,879,014 B2
(45) Date of Patent: Apr. 12, 2005

(54) SEMITRANSPARENT OPTICAL DETECTOR INCLUDING A POLYCRYSTALLINE LAYER AND METHOD OF MAKING

(75) Inventors: Sigurd Wagner, Princeton, NJ (US); Matthias Wagner, Boston, MA (US); Eugene Y. Ma, Brookline, MA (US); Adam M. Payne, Princeton, NJ (US)

(73) Assignee: Aegis Semiconductor, Inc., Woburn, MA (US)

( * ) Notice: Subject to any disclaimer, the term of this patent is extended or adjusted under 35 U.S.C. 154(b) by 434 days.

(21) Appl. No.: 09/813,454

(22) Filed: Mar. 20, 2001

(65) Prior Publication Data

US 2002/0145139 A1 Oct. 10, 2002

Related U.S. Application Data

(60) Provisional application No. 60/191,412, filed on Mar. 23, 2000, provisional application No. 60/191,441, filed on Mar. 23, 2000, provisional application No. 60/192,444, filed on Mar. 24, 2000, provisional application No. 60/192,443, filed on Mar. 27, 2000, provisional application No. 60/192,441, filed on Mar. 27, 2000, provisional application No. 60/192,440, filed on Mar. 27, 2000, provisional application No. 60/192,442, filed on Mar. 27, 2000, provisional application No. 60/192,953, filed on Mar. 29, 2000, provisional application No. 60/192,948, filed on Mar. 29, 2000, and provisional application No. 60/192,949, filed on Mar. 29, 2000.

(51) Int. Cl.[7] .............................. H01L 31/075
(52) U.S. Cl. .................. 257/458; 257/434; 257/449; 257/452; 257/457; 257/459
(58) Field of Search ................. 257/432, 436, 257/449, 452, 457, 458–460, 465, 466, 434, 53–55

(56) References Cited

U.S. PATENT DOCUMENTS

| | | | |
|---|---|---|---|
| 4,885,622 A | 12/1989 | Uchiyama et al. | |
| 5,162,239 A | 11/1992 | Winer et al. | |
| 5,185,272 A | 2/1993 | Makiuchi et al. | |

(Continued)

FOREIGN PATENT DOCUMENTS

| | | |
|---|---|---|
| EP | 0 125 390 A1 | 11/1984 |
| EP | 0 139 487 A1 | 5/1985 |
| EP | 0 178 148 A2 | 4/1986 |

(Continued)

OTHER PUBLICATIONS

Fernandes M et al., "VIS/NIR detector based on μc–Si:H p–i–n structures", Thin Solid Films, Elsevier Science S.A., Lausanne, CH, vol. 364, No. 1–2, Mar. 2000, pp. 204–208.

Kobayashi Y et al., "Improvement on Coupling Efficiency for Passive Alignment of Stacked Multi–Fiber Tapes to a Vertical–Cavity Surface–Emitting Laser Array", Extended Abstracts of the 1996 International Conference on Solid State Devices and Materials, Yokohama, Japan, 1996, pp. 655–657, XP 000694099.

(Continued)

Primary Examiner—Minh-Loan Tran
(74) Attorney, Agent, or Firm—Wilmer Cutler Pickering Hale and Dorr LLP

(57) ABSTRACT

Materials suitable for fabricating optical monitors include amorphous, polycrystalline and microcrystalline materials. Semitransparent photodetector materials may be based on silicon or silicon and germanium alloys. Conductors for connecting to and contacting the photodetector may be made from various transparent oxides, including zinc oxide, tin oxide and indium tin oxide. Optical monitor structures based on PIN diodes take advantage of the materials disclosed. Various contact, lineout, substrate and interconnect structures optimize the monitors for integration with various light sources, including vertical cavity surface emitting laser (VCSEL) arrays. Complete integrated structures include a light source, optical monitor and either a package or waveguide into which light is directed.

28 Claims, 23 Drawing Sheets

U.S. PATENT DOCUMENTS

| | | |
|---|---|---|
| 5,528,071 A | 6/1996 | Russell et al. |
| 5,539,848 A | 7/1996 | Galloway |
| 5,599,403 A | 2/1997 | Kariya et al. |
| 5,742,630 A | 4/1998 | Jiang et al. |
| 5,751,757 A | 5/1998 | Jiang et al. |
| 5,767,712 A | 6/1998 | Takemae et al. |
| 5,790,255 A | 8/1998 | Jackson et al. |
| 5,942,050 A | 8/1999 | Green et al. |
| 5,953,355 A | 9/1999 | Kiely et al. |
| 6,037,644 A | 3/2000 | Daghighian et al. |

FOREIGN PATENT DOCUMENTS

| | | |
|---|---|---|
| EP | 0 559 347 A1 | 9/1993 |
| EP | 0 860 885 A2 | 8/1998 |
| EP | 0 883 194 A1 | 12/1998 |
| EP | 0 899 835 A1 | 3/1999 |
| EP | 0 899 836 A1 | 3/1999 |
| JP | 60 210826 A | 10/1985 |
| JP | 07 168040 A | 7/1995 |
| JP | 08 250551 A | 9/1996 |
| WO | WO 89/03593 A1 | 4/1989 |
| WO | WO 99/30394 A | 6/1999 |
| WO | WO 01/73850 A2 | 10/2001 |

OTHER PUBLICATIONS

Wipiejewski T et al., "Vertical–Cavity Surface–Emitting Laser Diodes for Short Distance Optical Fiber Networks", Proceeding of the Electronic Components and Technology Conference, Washington, D.C., May 1–4, 1994, New York, IEEE, US, vol. 44, May 1, 1994, pp 330–334, XP 000479165.

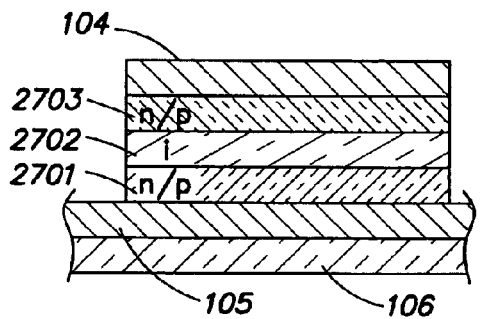
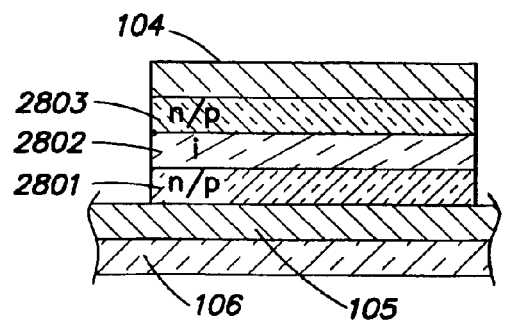
FIG. 27    FIG. 28
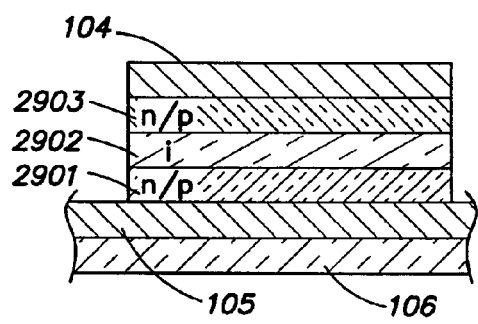
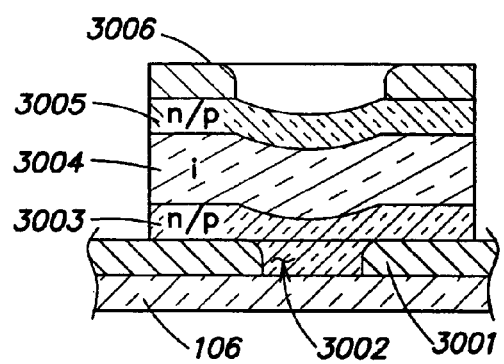
FIG. 29    FIG. 30

SEMITRANSPARENT OPTICAL DETECTOR INCLUDING A POLYCRYSTALLINE LAYER AND METHOD OF MAKING

CROSS-REFERENCE TO RELATED APPLICATION

This application claims domestic priority under 35 U.S.C. §119(e) to U.S. Provisional Patent Applications Ser. No. 60/191,412 filed Mar. 23, 2000, Ser. No. 60/191,441 filed Mar. 23, 2000, Ser. No. 60/192,444 filed Mar. 24, 2000, Ser. No. 60/192,443 filed Mar. 27, 2000, Ser. No. 60/192,441 filed Mar. 27, 2000, Ser. No. 60/192,440 filed Mar. 27, 2000, and Ser. No. 60/192,442 filed Mar. 27, 2000, Ser. No. 60/192,953 filed Mar. 29, 2000, Ser. No. 60/192,948 filed Mar. 29, 2000, Ser. No. 60/192,949 filed Mar. 29, 2000, all incorporated herein by reference.

BACKGROUND

1. Field of the Invention

The present invention relates generally to devices for monitoring the performance of optical systems. The present invention relates more particularly to devices for monitoring the performance of laser light sources used in communications and computation systems.

2. Related Art

The vertical cavity surface-emitting laser (VCSEL) is a relatively recent innovation in laser technology. It is part of a general class of devices called "surface emitting light emitting devices" (SLEDs) that have significant manufacturing and packaging advantages over conventional edge-emitting devices.

Semiconductor diode lasers have been produced for over a decade and are used extensively in both communications and in optical storage devices such as compact disks (CDs) and digital versatile disks (DVDs). The vast majority of these devices, however, rely on edge-emitting, e.g., Fabry-Perot or distributed feedback (DFB), lasers. These lasers are constructed on semiconductor wafers in such a way that when the wafer is diced, light is emitted from the cut edges. Edge emitting devices have a number of drawbacks: first, each laser takes a relatively large area on the semiconductor wafer, increasing cost; second, lasers cannot be tested until after they have been diced into individual units; third, linear arrays of lasers are more difficult to produce in high densities and two-dimensional arrays are altogether impossible to fabricate. The construction and fabrication of these lasers, however, is well known, and prices have benefited from large production volumes needed to satisfy the CD and DVD markets.

VCSEL laser cavities—rather than being patterned in the wafer plane, in a few layers of semiconductor—are patterned orthogonally to the wafer as many layers of semiconductor are deposited. The resulting lasers emit light perpendicularly to the surface of the wafer, and may be patterned in extremely high densities, either as individual devices or as one or two dimensional arrays. The result is a laser device that is inherently less expensive to produce than edge-emitting lasers. In addition, the vertical nature of these devices permits integration of additional electro-optical devices on the surface, for example adjacent each VCSEL.

Semiconductor light sources in general suffer from a number of problems associated with optical power control. Each semiconductor laser has a threshold electrical current needed before population inversion occurs i.e. there are more electrons in high energy state than in a low energy state, in its active region and coherent light is emitted. This threshold current needs to be supplied before any appreciable output is seen from a semiconductor laser. Above the threshold current, any increment in electrical current will lead to a corresponding increase in emitted optical power, up to a point. The ratio of the increase in optical power to electrical current is called the slope efficiency. Semiconductor lasers suffer from the fact that their threshold currents—and sometimes their slope efficiencies—can change significantly over operating temperature ranges and with laser age. This is a problem for a number of reasons. First, a single operating current cannot be set for the lifetime of the laser, unless it is set sufficiently high that output power will always exceed a desired minimum. This strategy has drawbacks: first, there may be eye safety issues when a laser is operated at greater than a certain power; second, operating the laser continuously at high power significantly reduces lifetime and further raises temperature, and as a result, threshold current; and finally, at high powers, high and low light output levels may be difficult to distinguish. Distinguishing between high and low light output levels is important in optical communications: a "one" and "zero" signal must be distinguishable to the receiver, and at the same time, the current levels for these signals should be as close together as possible in order to minimize switching time. It is therefore generally desirable to operate the laser at just above threshold for a "zero" level, and to use the minimum modulating current necessary to create "one" bits. The continuous current supplied is called the bias current. Thus a drift in the threshold current during operation can have highly detrimental results for users who wish to attain maximum bandwidth from such lasers while meeting eye safety and power consumption specifications. These optical power fluctuations are a problem not only for laser diodes or VCSELS; they affect other SLEDs as well, necessitating power control or monitoring for level-sensitive applications.

Various solutions have been developed for controlling optical output of diode lasers. The first category of solutions has to do with temperature monitoring and control. The idea is that one can either monitor temperature—or control it directly—of the laser device, and therefore eliminate drift in threshold current and slope efficiency tied to temperature fluctuations. The simplest solution is to place a temperature-monitoring device near the laser and to use the signal from this device to adjust the laser bias current and possibly the laser modulating current according to a pre-set formula determined from statistical sampling of the laser devices.

Another solution, which is used extensively in high-end communications modules employing edge-emitting lasers, is active control of laser temperature. The laser is placed on a substrate that has incorporated both a temperature-measuring device and a cooling device—most often a semiconductor heat pump such as a Peltier junction—that, through a control loop, keep the laser base at a constant temperature where the threshold current and slope efficiency are known (and usually optimal).

Thermal control solutions require significant space and power, and although they may be suitable for long-haul communications applications, such solutions are generally unacceptable in local-area or interconnect components where space is at an extreme premium.

Thermally-based solutions do not by themselves solve the problem of laser performance degradation over its operating lifetime. They can only compensate for changes in the ambient temperature, which, although important, are far from the only factor affecting laser optical output for a given current.

The most accurate way of controlling power output from the laser is to monitor the optical output directly. A class of technologies has been developed to monitor this output for both edge- and vertically-emitting semiconductor lasers.

Direct optical power monitoring for edge-emitting lasers is relatively straightforward due to the fact that these diode lasers emit light from both front and back facets. This allows the laser to be placed in an assembly where one aperture, at the front facet, provides the useful light for the application, while the other aperture provides light to a photodiode that is aligned precisely with the back facet. The usual technology used for this alignment is referred to as a silicon workbench. A silicon wafer has a surface patterned with mechanical alignment grooves using micromachining processes to produce a silicon workbench. Generally both the laser diode and the photodiode are placed in a "vee-groove" that runs along the light emission axis.

This type of assembly is used in CD and DVD players and recorders. For VCSELs, power monitoring is more complex, because the device does not generally emit light in the rear direction, i.e., through the substrate wafer. For laser wavelengths in excess of roughly 900 nm, a GaAs wafer, the usual VCSEL substrate would be transparent to the laser light. Thus, for such devices, an optical power monitor could be built on the reverse side of the wafer. However, VCSELS used for current communications applications generally operate in the 850 nm region for multimode fiber communications, and therefore generally require a different solution. The solution currently used by most manufacturers is to place the completed VCSEL die in an enclosure fitted with a partially reflective window above the VCSEL aperture and a photodiode onto which the partially reflective window projects some of the light from the VCSEL. Such an arrangement is called a backrefection monitor. Other solutions that have been proposed include photodiodes integrally built in the VCSEL structure using materials from columns III–V of the periodic table of the elements underneath the active layer; and photodiodes fabricated to monitor emissions from the side of the VCSEL structure. Both of these potential structures have not been used in production devices as a result of the significantly higher manufacturing complexities involved, and because of the fact that they do not directly monitor the same emission modes propagated by the surface-emitting device through its aperture, for example into a communication medium.

Current monitoring do not account for the fact that all lasers, even when fabricated closely together on a common substrate, may have very different characteristics. Many proposed applications, particularly in optical communications, require arrays of VCSELs used in parallel. Examples include high-speed interconnects built for server, router, or computer backplanes that feed into different waveguides. Although most arrays operate all devices at one wavelength, one proposed array would use an N×1 array of VCSEL, each tuned to a different wavelength combined with a multiplexer to provide wave-division multiplexed (WDM) communications capability. Such an array would have even greater power control issues than a single-wavelength array, because processing is slightly different for each laser. Conventionally, an additional VCSEL is constructed, at the end of array for the sole purpose of monitoring power output. However, this technique has severe drawbacks. Not only will it result in different average power levels coming from the lasers and, indeed, a higher required overall bias current than necessary in order to insure reliable function over lifetime, but may result in such disparities in power that an eye safety hazard results. This is of particular concern with a WDM system where multiple signals will travel through a single fiber to their destination, and aggregate optical power is measured to determine safety standards.

Another major drawback of current backreflection power monitors is the fact that light emanating from the VCSEL is not uniformly measured by the detector. Each VCSEL emits light not in a single beam or direction, but in various intensities in different directions off-axis, typically in a circular pattern. Typically VCSELs have beam divergence of 5–20°, with optical power unevenly distributed both by angle and radius in the beam. This poses a problem for an optical monitor that reflects part of the emitted light into a photodiode. This means that only a few of the modes of a VCSEL are measured by the photodiode. From VCSEL to VCSEL, then, the photocurrent produced in the detector will be vastly different, even for identical VCSEL output powers. The impractical result is that each VCSEL/monitor unit must be individually calibrated after assembly in order to know the relation between photodiode current and actual optical power produced by the VCSEL. This uncertainty is reflected in current product data sheets by the "photocurrent at typical VCSEL power," which varies from min to max by as much as a factor of 10. Moreover, the relative intensities of the modes emitted by a VCSEL will change over temperature and age which means that the conditions observed during calibration may not exist over the entire operating lifetime of the VCSEL, and significant distortions of the power feedback signal may result over time. Other issues such as the mechanical and optical stability of the semireflective window used to direct light back to the photodetector will affect measurement as well. For example, dust on the outside of the window may cause significantly higher backreflection, leading to an overestimate of delivered laser power.

Current VCSEL/monitor units must exceed a certain minimum size because the partially-reflective window used to direct some light back towards the photodetector must be a set distance away in order to take advantage of the VCSEL's natural beam divergence. One partial solution to the problem has been to angle the window, which increases the reflected light and reduced the minimum distance required between the VCSEL and the window. However, even with this partial solution, direct integration of the VCSEL with waveguides—or, for that matter, incorporation into any other package that does not easily incorporate a window—is still impossible (assuming a power monitor is required). One of the VCSEL's potential strengths is that it could be directly coupled to waveguides and fibers, and bonded to a variety of surfaces; this strength of the VCSEL cannot be exploited using conventional technologies.

A highly desirable solution, unrealizable using conventional technologies, would be a semitransparent photodiode for monitoring laser diode output. All modes of the laser diode could be captured reliably achieving a consistent ratio between emitted optical power and photodiode current, and eliminating the calibration step during manufacturing. The overall VCSEL package could be made much more compact than at present if the photodiode could be added as a "layer" over the VCSEL. However, no such device has yet appeared because of numerous problems heretofore thought insurmountable.

One area of difficulty involves engineering a semiconductor device that has good responsivity to an optical signal of a desired wavelength; has a low dark current in order to provide sufficient contrast; transmits the majority of the light shining through it without excessively scattering it; has stable performance over a range of temperatures; is reliable over a long operating lifetime; and can be produced with consistent parameters. Even to experts in the field, the fabrication of devices meeting all these parameters has proven impossible.

Dark current in photodetectors is a perennial issue, particularly when the photodetector is stretched to meet other specifications such as responsivity at a particular wavelength and partial transparency. Dark current consists of two major components: that resulting from bulk semiconductor material and device properties, and that resulting from the specific construction of the device. The former component is minimized by carefully engineering the semiconductor layers in order to maximize the resulting signal-to-noise ratio. The latter component, that dependent on the specific construction of a single device, must be mitigated using fabrication methods. In the case of the semitransparent photodetector for laser power monitoring, a new and novel structure is required in order to minimize dark current while preserving functionality in the application-specific device. A particular problem is the leakage on the edges of the device.

In many cases it is desirable to build tall microelectronic structures for sensor or actuator applications. For many of these applications a top conductive contact with a lineout to a contact pad is required. When the conductor used for this connection is relatively thin when compared to the structure's height and is deposited by a directional method that preferentially deposits on surfaces parallel to the substrate broken connections often result.

Using standard metal deposition techniques like electron-beam deposition or thermal evaporation, metal is deposited perpendicular to the substrate, and therefore preferentially coats surfaces parallel to the plane of the substrate. An immediate potential solution was to use very thick layers of metal to form the contact once the layer is thick enough it will reach over the edge of the PIN stack; this fix, however, brings with it other problems when working with thin films. In particular, the film stress induced by such a thick layer will tend to peel off the entire photodetector structure.

In many cases it is desirable to build "tall" microelectronic structures for sensor or actuator applications. For many of these applications a top conductive contact with a lineout to a contact pad is required. When the conductor used for this connection is relatively thin when compared to the structure's height, and is deposited by a directional method that preferentially deposits on surfaces parallel to the substrate, broken connections often result.

Another problem is because the entire PIN structure was extended for large areas under the insulating layer and contacts i.e., areas that do not contribute to the intended photoresponse of the device, the dark current exhibited by the devices rose significantly for two reasons: (1) there is a much larger bulk of PIN stack that will produce purely thermal currents, particularly at higher temperatures and (2) the leakage currents produced along the extended edges of the structure rise. These effects are particularly noticeable when a high reverse bias is used to increase the response of the detector to light.

SUMMARY OF THE INVENTION

According to one aspect of the invention, semitransparent optical detector includes a semitransparent PIN diode having at least one polycrystalline semiconductor layer. The polycrystalline semiconductor can be polycrystalline silicon, which can be microcrystalline. In a variation, the polycrystalline semiconductor can be a polycrystalline alloy of silicon and germanium. The polycrystalline alloy can be microcrystalline. The same material need not be used throughout. The PIN diode can have another layer of at least one of an amorphous semiconductor and a microcrystalline semiconductor. The detector can include a transparent substrate upon which the PIN diode is disposed, and a transparent conductor disposed on a surface of the PIN diode.

According to another aspect of the invention, a method of making a semitransparent optical detector includes fabricating an amorphous semiconductor PIN diode on a transparent conductor, and recrystallizing the amorphous semiconductor. Recrystallizing can include placing the amorphous semiconductor in a processing furnace. During recrystallizing, a forming gas of $H_2$ and $N_2$ can be flowed through the processing furnace. The temperature in the processing furnace can be raised to at least about 800° C. In a variation, fabricating can include depositing amorphous silicon as the amorphous semiconductor. Recrystallizing can include depositing the transparent conductor on a transparent substrate, and rapidly annealing the amorphous semiconductor with high intensity heat applied to a side thereof away from the transparent substrate. In this variant, the amorphous semiconductor can be exposed to an argon plasma before rapidly annealing. Recrystallizing can include exposing a region of the amorphous semiconductor to a laser pulse having sufficient energy to locally raise a temperature of the amorphous semiconductor above about 800° C.

According to another aspect of the invention, a method of making a semitransparent optical detector includes depositing a transparent conductor onto a transparent substrate, and growing a polycrystalline PIN diode on the transparent conductor using high-temperature thermal chemical vapor deposition. A variation of this aspect has growing the polycrystalline PIN diode further including raising a temperature at which growing is performed above about 800° C.

BRIEF DESCRIPTION OF THE DRAWINGS

In the drawings in which like reference designations indicate like elements:

FIGS. 27, 28, 29 and 30 are schematic cross-sections of PIN diode structures employing heterojunctions;

DETAILED DESCRIPTION

The present invention is now illustrated by the following detailed description of a number of embodiments and aspects thereof.

In illustrating the present invention, some basic materials, basic structures, advanced material, advanced structures and complete devices are now described. The various materials and structures are described in relation to a number of preferred combinations. However, it will then be apparent that other combinations of the same materials and structures are suggested by the described combinations. All such combinations are contemplated as within the scope of this disclosure.

Basic Materials

In order to build semitransparent optical detectors, semitransparent materials are required. In order to use conventional crystalline silicon semiconductors one would need to cut a single-crystal wafer so thin that most of the monitored beam could pass through the wafer and a detector patterned on it using conventional integrated-circuit processes. The advantage of this method is that conventional semiconductor processing techniques could be used to fabricate the photodiode on the wafer. However, the process is relatively expensive. Only very limited tuning is possible when photodetectors are formed using conventional processing, and crystalline silicon in general has very poor absorption, so that relatively thick layers may be required to produce sufficient photocurrent for a control signal.

The advantages of using thin-film, directly-deposited semiconductors for such detectors are multiple and powerful: first, a variety of substrates, including low-cost glass and perhaps even the VCSEL wafer, may be used; second, these semiconductors may be processed in very large areas; third, because the semiconductor is deposited directly, the layers of the material may be very precisely tuned for the application—which will help to meet all the requirements of the much-needed semitransparent laser monitor. In addition, the ability to fabricate not only amorphous but also microcrystalline and polycrystalline semiconductors in thin-film form gives the designer a high degree of flexibility in tuning the photodetector for specific wavelengths, signal-to-noise requirements, thicknesses, transmission, etc.

Several potential devices could serve as photodetectors: PN junctions, PIN diodes, phototransistors, photodarlingtons, and metal-semiconductor, i.e., Schottky diode junctions. All of these devices are theoretically possible to construct in a thin-film semiconductor version. For simple devices, PN junctions and PIN diodes are viable alternatives. PN junctions, however, do not trap sufficient light to produce feedback currents that, without amplification, could be used by current laser driver chips.

Figure 1:
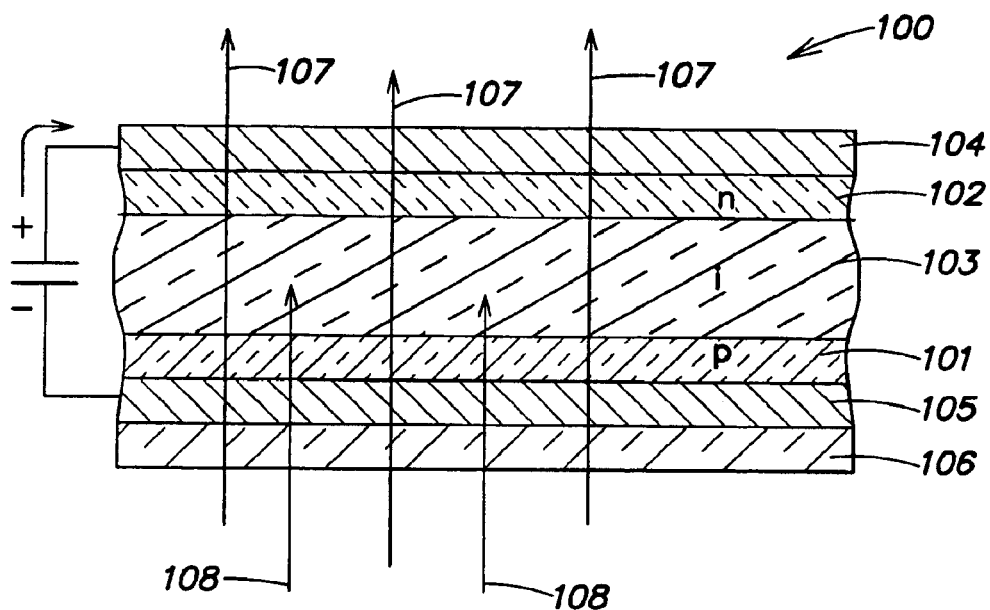
FIG. 1 is a cross-section of a PIN diode according to some aspects of the invention.

The PIN photodiode 100, for example as shown in FIG. 1, is the illustrative simple detector throughout this discussion because it combines relative simplicity e.g., a one-pass semiconductor deposition process with effectiveness in generating the photocurrent response required in the application. The PIN diode 100 of FIG. 1 includes a thin P-layer 101 and N-layer 102 surrounding a thicker I-layer 103. Contact may be made through a top transparent conductor 104 and a bottom transparent conductor 105. The entire structure is constructed on a transparent substrate 106. Light is transmitted through the device 107. Some light 108 is absorbed. In addition the intrinsic (I) layer of the PIN photodiode may be extensively tuned to absorb 108 the wavelength of interest. Note that integration of transistors in thin films is well-known; as a result, an integrated package forming a phototransistor or even more complex optoelectronic circuit is possible, and potentially desirable given the drive for compactness in optoelectronic and optical networking products.

Amorphous silicon is one desirable material for use in optical detection devices because it has high absorption in visible wavelengths, and processing is very well known. The material has been used extensively for solar panels because it may be deposited cheaply over large surfaces and absorbs the solar spectrum well. In addition, versions of the material may be deposited at low temperatures, less than 300° C., allowing it to be deposited directly onto a variety of substrates, including glass, plastics, and other electronic components, including CMOS and III–V wafers, including VCSEL wafers. The central problem in using this attractive material for laser power control is that it has only a limited response at the long wavelengths typically attractive for optical communications. The poor response of amorphous silicon is due to its bandgap. Optical communications lasers generally transmit at 1330 nm and 1550 nm for singlemode fiber communications, i.e., long-haul and metro links, and at 850 nm for multimode fiber, i.e., local-area and interconnect links.

Achieving sufficient photon absorption and photocurrent at long wavelengths, even 850 nm, requires a new approach to the materials of the PIN semiconductor device.

Figure 2:
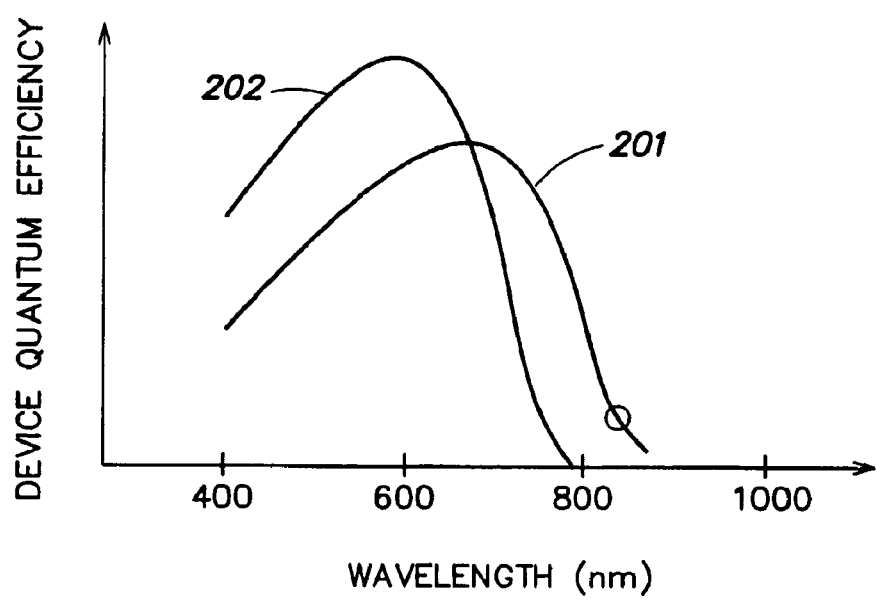
FIG. 2 is a graph of quantum efficiency versus wavelength for amorphous silicon and amorphous silicon-germanium alloys.

To achieve the necessary responsivity using amorphous silicon, germanium can be added to form a silicon-germanium alloy in the intrinsic I-layer 103 of the PIN structure 100. The resulting structure has a narrower bandgap that enables sufficient absorption to generate on the order of 50 $\mu$A photocurrent in response to a 1.5 mW optical signal at 850 nm. A comparison of the quantum efficiency of the amorphous-silicon germanium device 201 with that of an amorphous-silicon only device 202 is shown in FIG. 2. In addition, the germanium concentration was optimized in such a way as to keep the dark current to low levels, producing over 100:1 SNR ratios at a range of reverse bias voltages up to approximately 2–3V, roughly. This result for a semitransparent detector represents a major advance in the state of the art in VCSEL monitor technology because it allows for capture of all laser modes, extremely compact integration with packaging or the laser itself, and continued use of chipsets developed for use with backreflection monitors.

Figure 3:
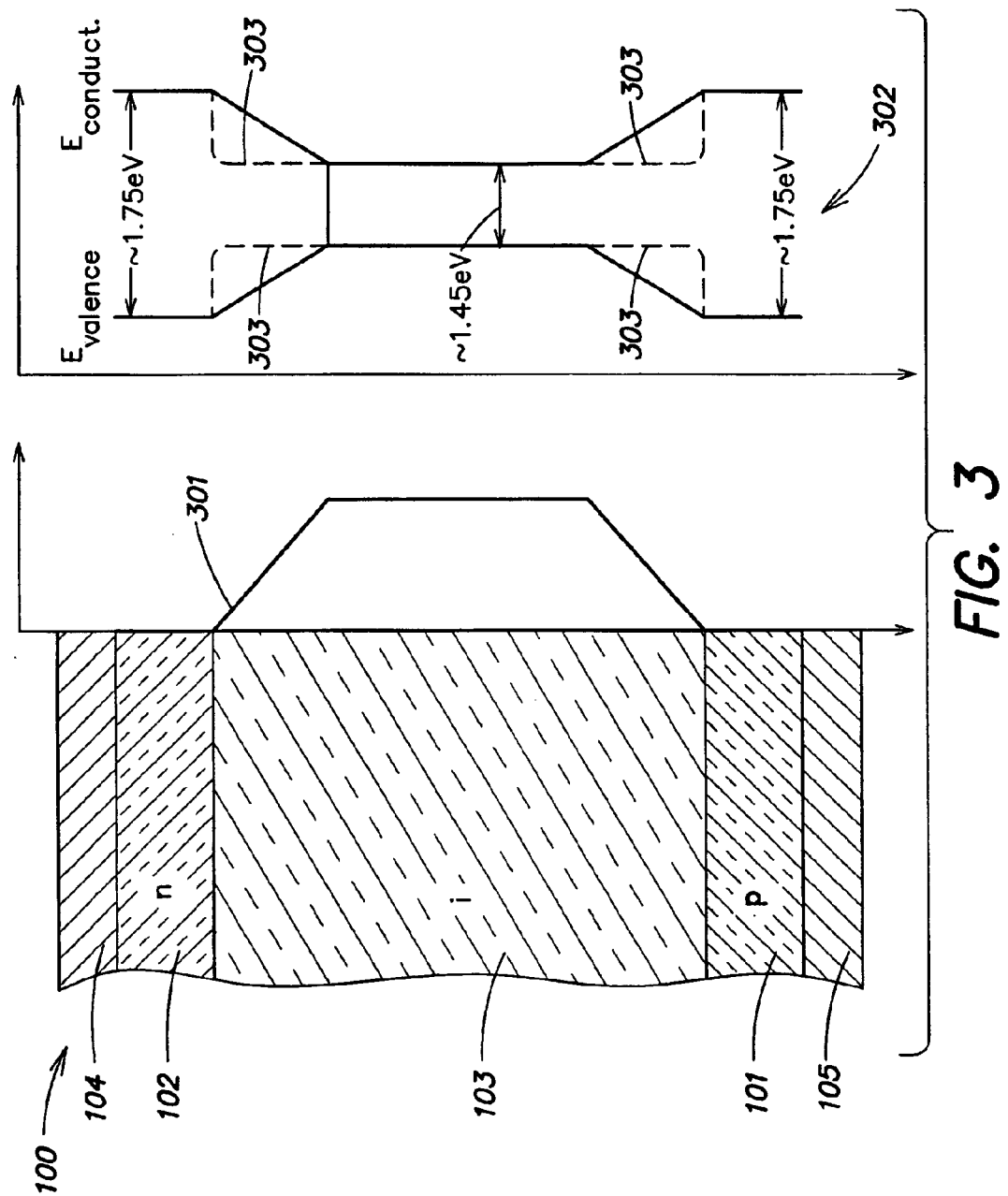
FIG. 3 is a cross-section and graph showing the effect of germanium concentration in the intrinsic layer of a PIN diode.

Semitransparent PIN devices constructed from amorphous silicon—germanium alloys exhibit high levels of absorption in the 850 nm range for optical communications lasers and a relatively low saturation point under reverse bias. These devices can be constructed using a graded concentration of germanium, where there is no Ge present in the alloy at the P and N interfaces, and the concentration rises in the center of the I layer. The result is a smooth valence band transition to the N and P layers, while photon absorption at the wavelength of interest is high in the center of the layer. A depiction of the graded concentration 301 together with the smoothly-varying (and narrowing) bandgap 302 is shown in FIG. 3. The grading 301 eliminates the bandgap mismatch 303 which causes a pileup of charge carriers at the interfaces when the electric field is low, which in turn leads to unwanted carrier recombination at the interface and lower photocurrent. As a result of the grading 301, the PIN photodiode 100 may be run at reverse bias voltages as low as 1V, or even unbiased and still produce a over 75% of the photocurrent observed at 2–3V reverse bias. This result is highly beneficial as optoelectronic circuits migrate to lower-voltage operation.

Making the Basic Materials

The exemplary semitransparent PIN device 100 can be fabricated using equipment such as that used to build amorphous silicon solar cells in large quantities. For example, devices can be fabricated using a plasma-enhanced chemical vapor deposition (PE-CVD) process, although other well-known methods exist for depositing amorphous silicon. The amorphous silicon device itself is fabricated as follows, with the specific process parameters dependent on the precise machine used:

1. In a vacuum deposit a transparent conductor, e.g. an oxide, on a substrate that is transparent to the wavelength of interest.

2. Without removing the substrate from vacuum, and having the substrate at an elevated temperature, e.g., about 300° C. or higher throughout the process, but as low as about 200° C. for sensitive substrates, perform the following steps to fabricate the semiconductor detector layers:

a. deposit a relatively thin p-doped layer of amorphous silicon using commonly-known dopant such as boron;

b. deposit a relatively thick intrinsic layer of amorphous silicon with germanium provided by germane ($GeH_4$), with concentrations depending on the target wavelength and machine and process specifics; and c. deposit a relatively thin N-doped layer of amorphous silicon using a dopant such as phosphorous.

3. Deposit a transparent conductor on top of the resulting PIN stack, to serve as the top contact for the device.

Figure 4:
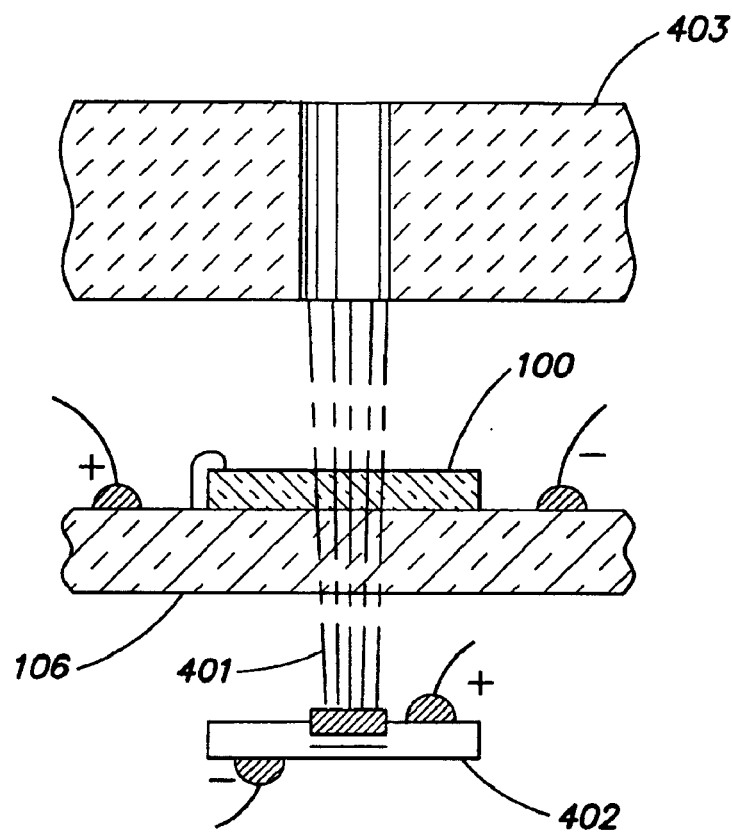
FIG. 4 is a schematic cross-section of a system including a light source and a semitransparent PIN diode.

The resulting device 100 may be employed to monitor any light source up to roughly 850 nm or higher. The PIN photodiode 100, on its substrate 106, constructed as described above, is simply placed in the path of the emitted beam 401, for example of a VCSEL 402 as shown in FIG. 4. After passing through the PIN diode 100, the beam 401 enters an optical fiber waveguide 403.

Figure 5:
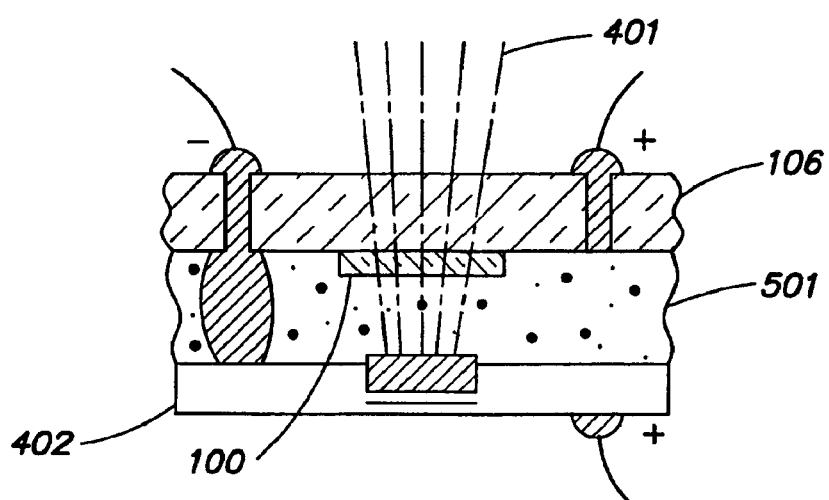
FIG. 5 is a schematic cross-section of a system including a light source and a flip bonded PIN diode on a substrate.
Figure 6:
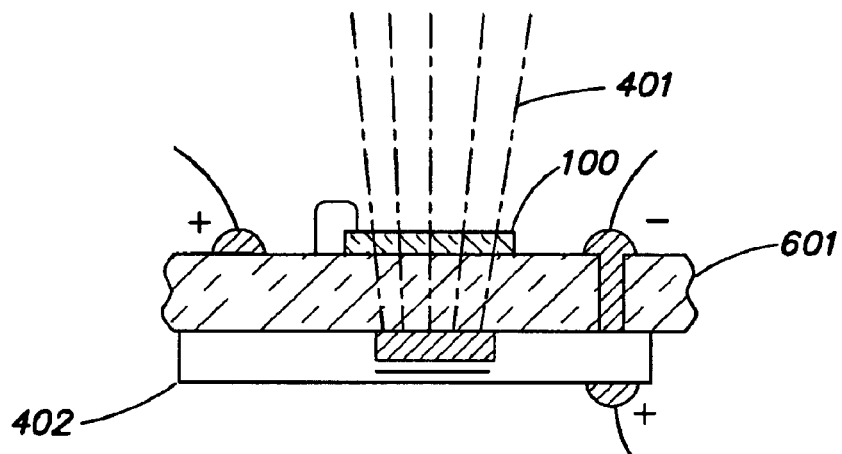
FIG. 6 is a schematic cross-section of a light source and a semitransparent PIN diode constructed on the surface of the light source.
Figure 7:
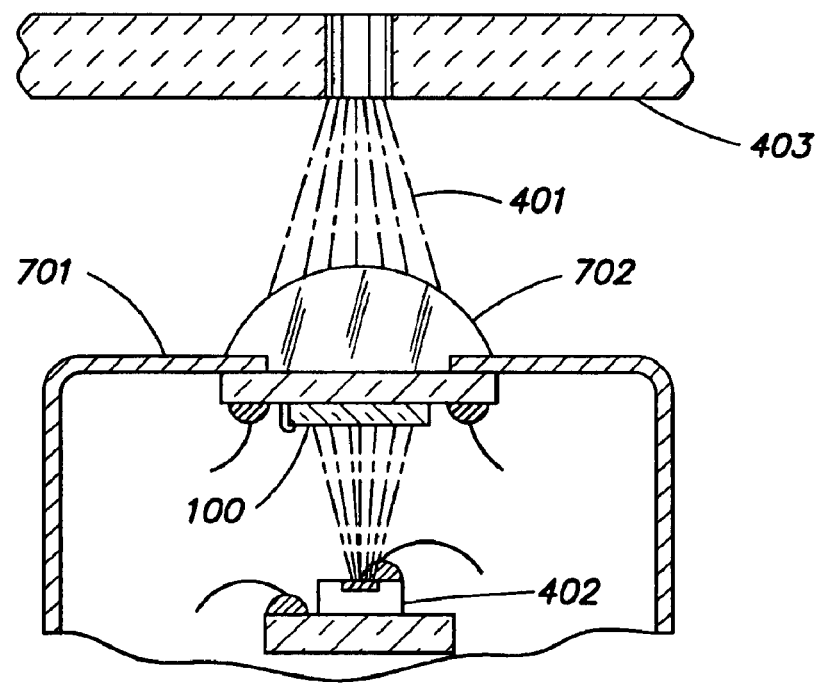
FIG. 7 is a light source in a package including a semitransparent PIN diode.

Potential packaging of the PIN device 100 includes bonding the substrate 106 to the VCSEL chip 402 using, for instance, an optical epoxy 501, FIG. 5; fabricating the PIN 100 directly on the VCSEL 402 with a transparent layer 601 to separate the two devices, FIG.6; fabricating the PIN 100 on a piece of the VCSEL housing 701 such as the TO can window 702, FIG. 7. Direct integration on a wafer scale, either through direct deposition of the PINs 100 on a coated wafer, results in a device structure as seen in FIG. 6 or through bonding the PINs 100 on their substrate 106 to surface light-emitting devices on the wafer 402, producing a device structure shown in FIG. 5. Many other configurations may be designed for compactness, reliability, and cost savings.

The amorphous silicon/graded silicon-germanium device can be fabricated as follows, with the specific process parameters dependent on the precise machine used:

1. In a vacuum, deposit a transparent conductor on a substrate that is transparent to the wavelength of interest.

2. Without removing the substrate from vacuum, and having the substrate at an elevated temperature throughout the process, perform the following steps to fabricate the semiconductor detector layers:

a. deposit a relatively thin p-doped layer of amorphous silicon using commonly-known dopant such as boron;

b. deposit a relatively thick intrinsic layer of amorphous silicon with germanium provided by germane ($GeH_4$), at up to 100% germane as a total of entire gas volume, depending on machine and process specifics (the germane concentration should be varied from about 0% concentration at the P-I and N-I interfaces, with a ramp up at both interfaces to the desired maximum level depending on exact wavelength of interest which is then maintained for a substantial portion of the I layer; and c. deposit a relatively thin N-doped layer of amorphous silicon using a dopant such as phosphorous.

3. Deposit a transparent conductor on top of the resulting PIN stack, to serve as the top contact for the device.

Basic Structures

In order to produce devices economically which possess various desired characteristic, we have invented several new basic structures. These structures address issues relating to reducing the dark current, making electrical contact with the device, and other.

Figure 8:
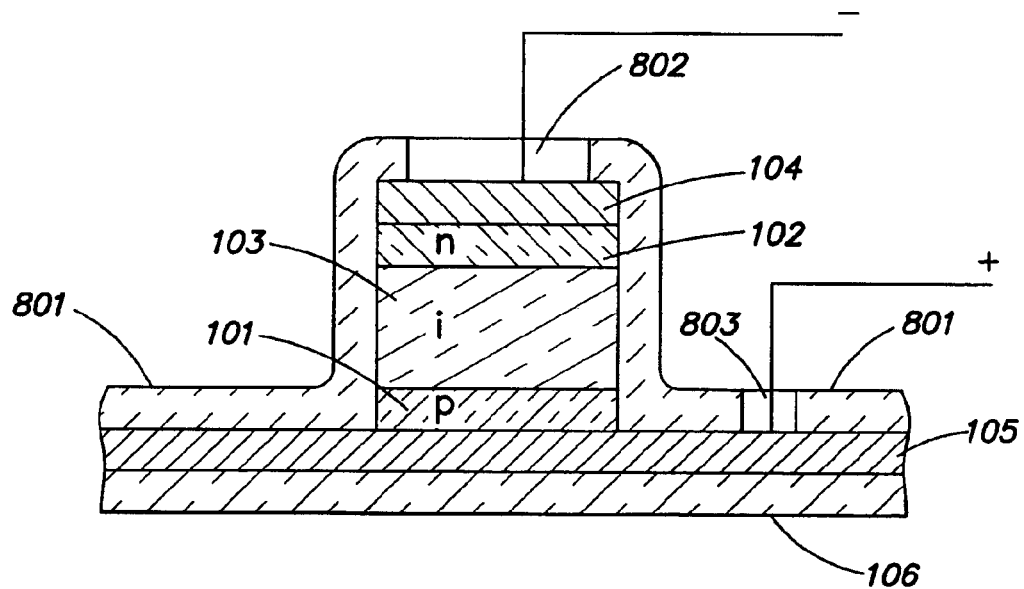
FIG. 8 is a schematic cross-section of a PIN diode including an edge passivation layer.

In order to control and reduce dark current, as shown in FIG. 8, an integrated, insulating shell 801 can be constructed around our photodetectors according to aspects of the invention that minimizes edge currents around the photodetector device. After depositing a pattern bottom contact layer 105, if needed, the photodetector stack 101, 102, 103, and the top transparent conducting window 104, if needed an insulating layer 801 can be added to the device. This insulating layer 801 can optionally then be removed from the window area 802 and from the point 803 where contact must be made to the bottom contact. In this construction, the layer 801 acts not only as the passivating edge layer for the photodetector device, but also as an insulating layer 801 between top and bottom contacts and lineouts (not shown). Among the materials that can be used for this layer are silicon nitride, silicon dioxide, and a polymer such as polyimide. Silicon nitride and silicon dioxide are compatible with, and can be added using well know PE-CVD processes. If the layer 801 has adequate transmissivity in the wavelength of interest, it may be preferable to leave the layer intact (not shown) over the top photodetector window 802, removing it only at the edges in order to make contact to the top of the photodetector 102 or the transparent conductor 104 used on the top of the photodetector. In this way the layer 801 would form a protective layer over the photodetector and/or transparent oxide, preventing degradation or mechanical damage.

The material for the layer can be selected for its optical properties. The barrier may form an antireflective coating if it has the appropriate index of refraction, for example, as well as its mechanical and chemical compatibility with the structure and processes used. These aspects of the barrier are particularly important in devices in which a top transparent conductive layer is not added to the photodetector, which may be the case when the detector aperture is small and the detector is made from a microcrystalline or polycrystalline semiconductor, or in a novel hybrid-layer manner described below. In such structures the top transparent conductor 104 may be omitted, and a protective layer 801 is required on the top semiconductor layer 102 (N- or P-layer).

Figure 9:
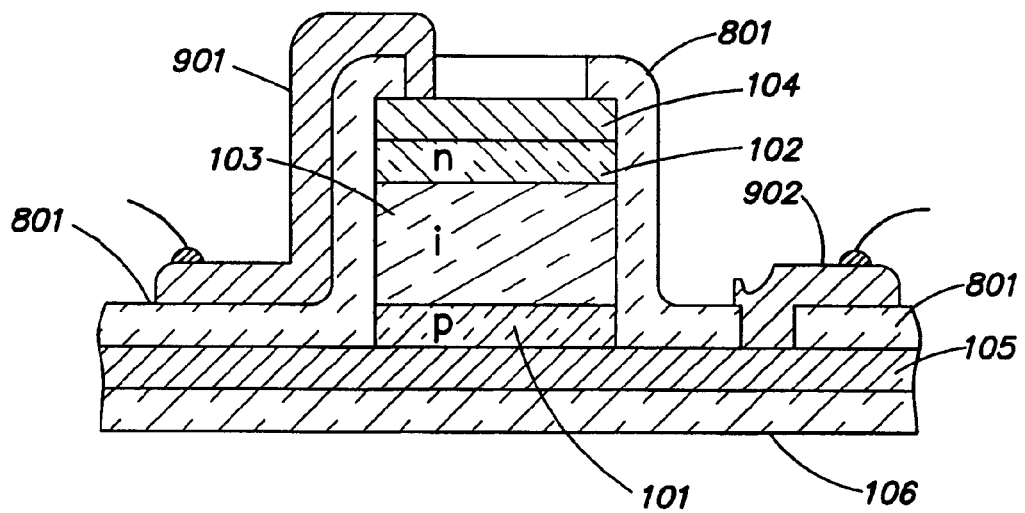
FIG. 9 is an edge passivated PIN diode structure showing a first metallization system.
Figure 10:
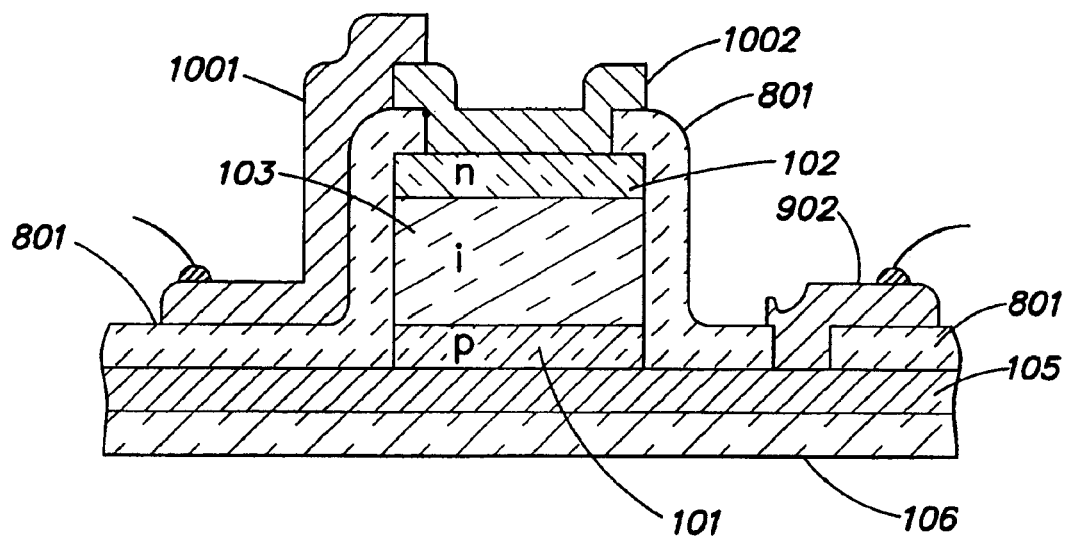
FIG. 10 is a schematic cross-section of an edge passivated PIN diode showing a second metallization system.
Figure 11:
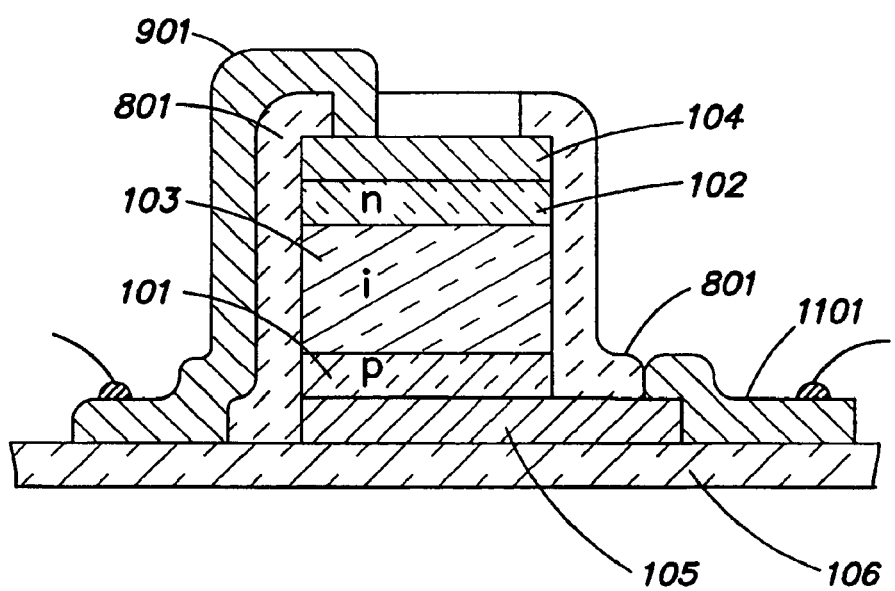
FIG. 11 is a schematic cross-section of an edge passivated PIN diode showing a third metallization system.

FIGS. 9–11 show three structures employing the principles introduced above. They each show a PIN diode including a P-layer 101, I-layer 103 and N-layer 102, constructed on a transparent conductor 105 and substrate 106, and capped by another transparent conductor 104. In FIG. 9, metallization 901 contacts the top transparent conductor 104, while metallization 902 contacts the bottom transparent conductor 105. In FIG. 10, metallization 1001 contacts a top transparent conductor 1002 which has been brought outside of the passivation layer 801. Metallization 902 contacts bottom transparent conductor 105 as described above. In FIG. 11, metallization 901 makes contact with the top transparent conductor 104 as above, while metallization 1101 is deposited on bare substrate 106 to contact bottom transparent conductor 105.

Another issue which arises in building a semitransparent photodetector is series resistance. A certain aperture must be maintained on both ends of the photodetector in order to allow laser light to pass through unobstructed. A basic tenet of the semitransparent detector for laser power control, after all, will be that the light captured in the detector must be linearly related to the light actually passing through the detector unobstructed. This restricts the type of conductive material that may be used at either end of the photodetector. Generally a transparent conductive oxide will be used to make contact 104, 105 to the top 102 and bottom 101 layers of the detector 100. These oxides, however, have limited conductivity, particularly when they are made relatively thin. If the aperture is small and the top 102 and or bottom 101 layers of the detector are made of non-amorphous (microcrystalline or polycrystalline) material, which has better conduction, the transparent conductors 104, 105 may be left off altogether. However, it is desired to minimize the product of distance and resistivitiy from good conductive leads to the locations in the device where electron-hole pairs are created.

The structure next described, which provides such a contact, requires only a single deposition and patterning step for the metal layer, which is applied as one of the final layers in the semitransparent PIN structure. The structure of these contacts minimizes the average distance from the point of carrier generation to a metal lead while ensuring proper isolation for reliable measurements. In addition, the contact structure minimizes any capacitive effects that might occur.

Figure 12:
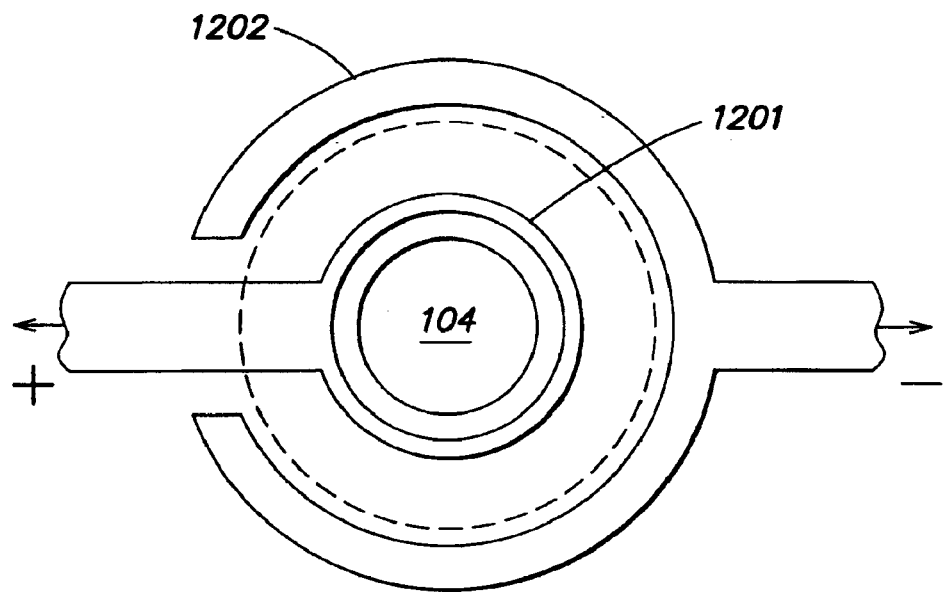
FIG. 12 is a plan view of a contact structure for an edge passivated PIN diode.
Figure 13:
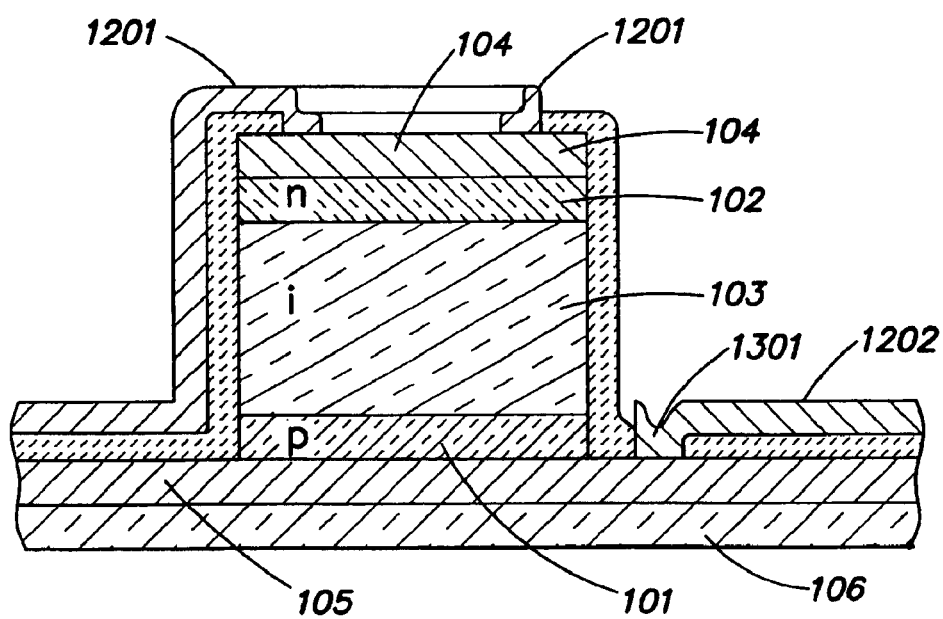
FIG. 13 is a schematic cross-section of an edge passivated PIN diode having the contact structure illustrated in FIG. 12.
Figure 14:
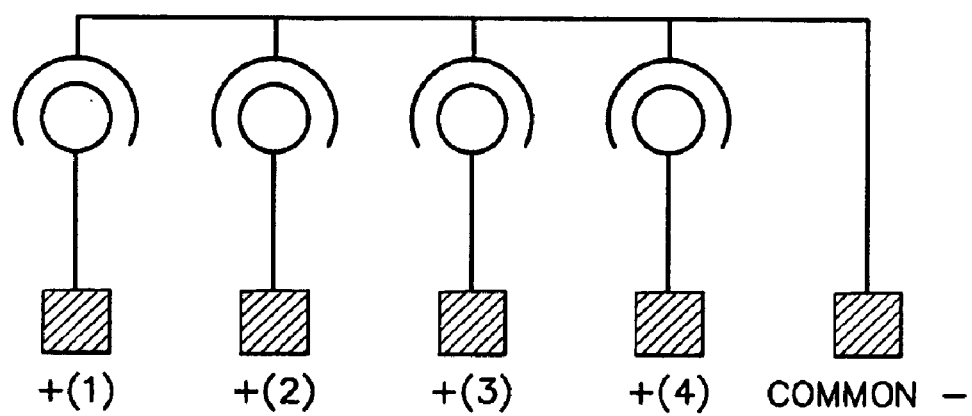
FIGS. 14 and 15 are plan views of PIN diode arrays employing the contact structure of FIGS. 12 and 13.
Figure 15:
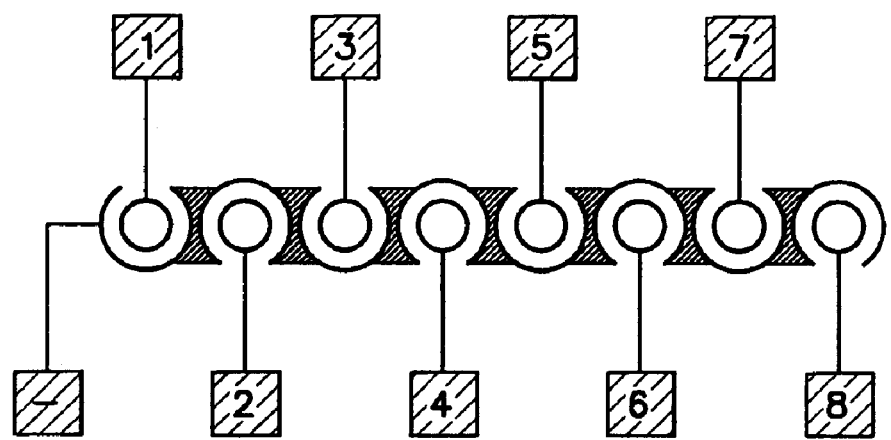

The structure consists of an inner top contact ring 1201 and an outer bottom contact ring 1202, as shown in FIGS. 12 and 13. The inner ring 12 contacts the top of the PIN stack, or the transparent conductor 104 that has been applied to the top of the stack. The outer ring 1202 contacts, through an arc-shaped via 1301 patterned in an insulating layer, the bottom conducting layer 105, which may be either a transparent conductor 105 covering the entire PIN aperture or any conductor that contacts the bottom layer 101 of the PIN. The metal contacts 1201, 1202 may be fabricated using aluminum, chromium, or other conductors compatible with standard deposition processes such as thermal or e-beam evaporation or sputtering. After a thin-film conductor has been formed, it may be most effective to plate it with a good contact layer (electroless gold plating, for instance) to guarantee contact reliability in the final assembly. The ring-shaped conductors 1201, 1202 minimize the distance from points on the detector to contacts for outside control circuitry (or to integrated circuitry). A ring also ensures the highest uniformity in response to different optical paths through the detector. Representative arrays using the described structures are shown in FIGS. 14 and 15.

Figure 16:
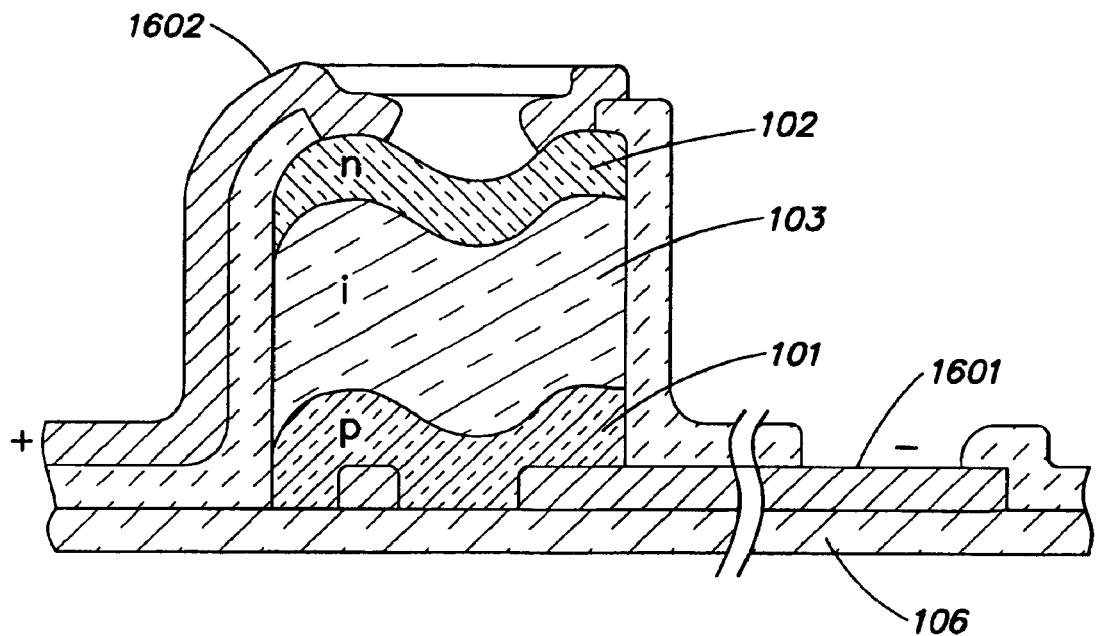
FIG. 16 is a schematic cross-section of an edge passivated PIN diode including a different ring contact structure.
Figure 17:
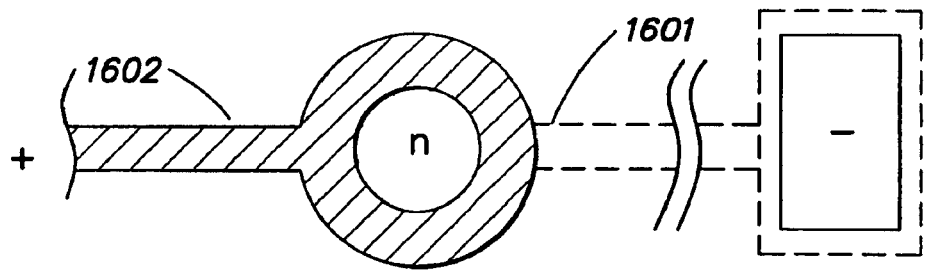
FIG. 17 is a plan view of the PIN diode and contact structure of FIG. 16.

As shown in FIGS. 16 and 17, if the bottom metallization 1601 is deposited on the substrate first, the rings on bottom metallization 1601 and top metallization 1602 can both be unbroken circles, superposed one above the other.

Because of the height of some PIN structures described relative to the thickness of metallization used for lineouts to contact pads, broken lineouts can be a problem, as described in the Background.

A structure that eliminates the problem of broken lineouts in the described photodetectors is now discussed in connection with FIGS. 18–22. The structure is a tapered sidewall structure for the PIN stack itself. The tapered sidewall (FIG. 22, 2201) is angled so as to provide a surface for metal to be deposited using standard evaporation and e-beam methods. This tapered structure is manufactured by using an etch solution that attacks not only the PIN stack, but also the patterned photoresist as well to remove unwanted material from around the PIN stack. The result is that as the structure etches, the protected area becomes gradually smaller, leading to a tapered sidewall 2201 as shown in FIG. 22. Either a wet or a dry etch may be used for this process. In a dry etch system, a measured concentration of oxygen is added to the etch plasma, and the oxidizing effect shrinks the photoresist during PIN stack etching.

There are several advantages to this structure. Metal line-outs are much less likely to be broken when the PIN sidewall is tapered. The dark photocurrent of the structure is actually reduced because of the slightly longer edge paths. No additional steps are introduced into the manufacturing process, although the etch chemistry and timing must be more carefully controlled.

Figure 18:
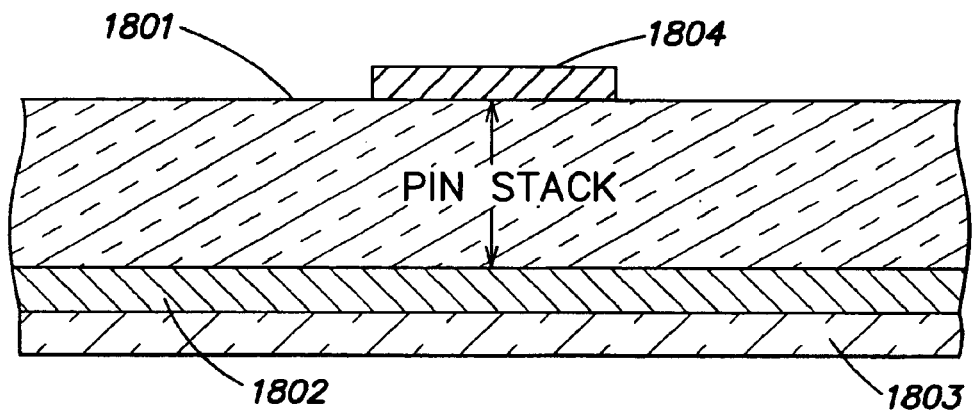
FIGS. 18, 19, 20, 21 and 22 are schematic cross-sections of a PIN diode structure having tapered sidewalls, during the fabrication thereof.
Figure 19:
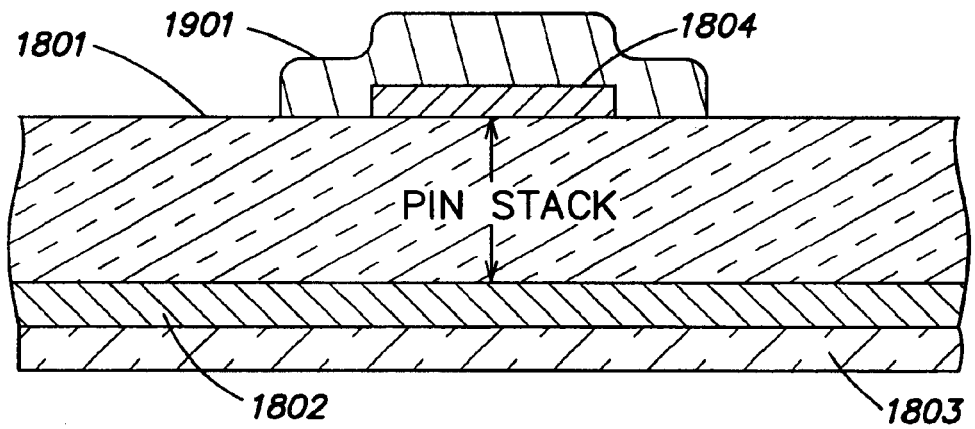
Figure 20:
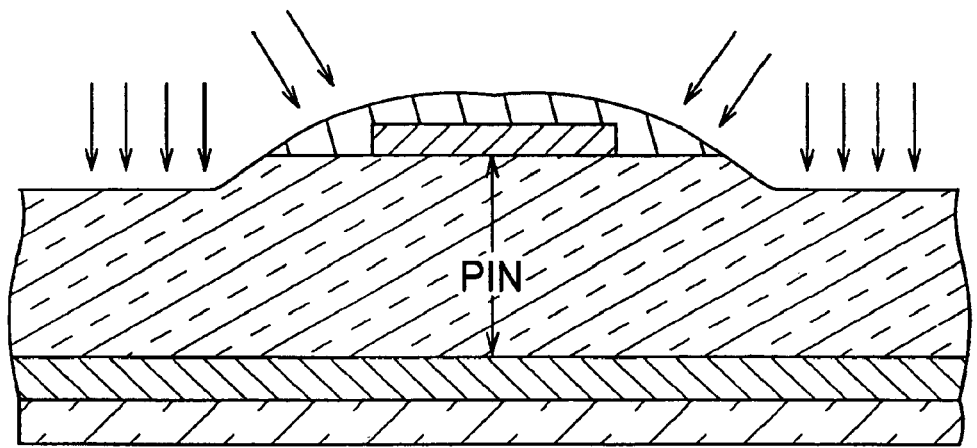
Figure 21:
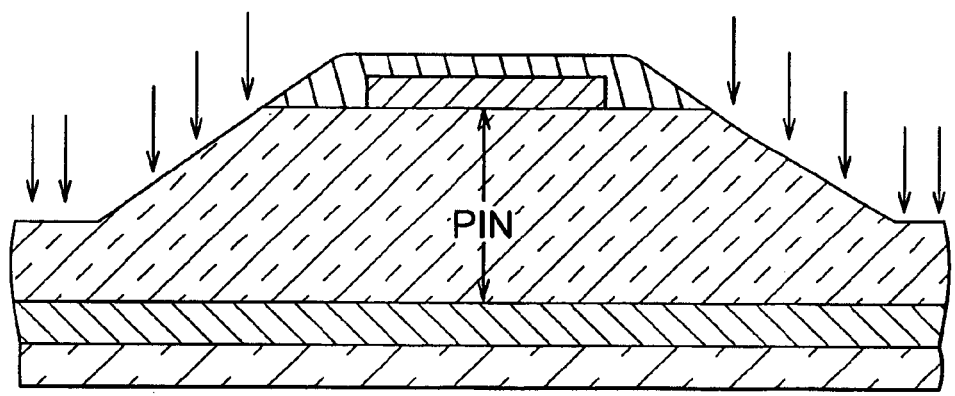
Figure 22:
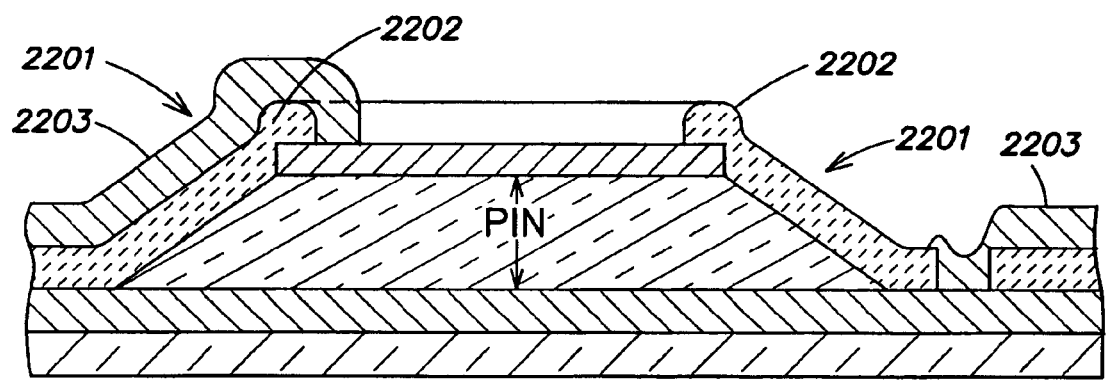

FIGS. 18–22 illustrates the process and structure for one particular type of detector. A PIN photodetector semiconductor stack (FIG. 18, 1801) is deposited on the transparent conductor (FIG. 18, 1802) which has previously been deposited on the substrate (FIG. 18, 1803). A transparent conductor (FIG. 18, 1804) is patterned on top of the stack where the detector aperture will be. Photoresist (FIG. 19, 1901) is then patterned over and around the detector aperture to define the PIN structure. The extent of the photoresist is determined by the relative rates of etch of the PIN and of photoresist, the PIN and photoresist thicknesses, and the desired angle of the PIN structure's sidewall. The structure is then etched as shown in FIGS. 20 and 21. Both the PIN stack and the photoresist are attacked by the etchant, gradually uncovering new PIN surface as photoresist is etched away. The etch process continues, stopping at the bottom conductor and the top conductor, though timing must be accurate to ensure the sloped PIN stack is not eliminated completely. An insulating layer (FIG. 22, 2202) and a conductor layer (FIG. 22, 2203) are patterned on to the tapered PIN structure. The conductor (FIG. 22, 2203), deposited by standard e-beam or evaporation techniques, remains integral between the contact pad and the top PIN contact.

In order to improve the performance by restricting the photoelectrically active region and the electrically active region of the device, embodiments of the invention including structures where the active area is defined by the top and/or bottom contacts to the PIN stack are now described. These contacts may be defined in two ways. They may be defined through patterning of the conductor itself or through patterning of an insulating layer.

Figure 23:
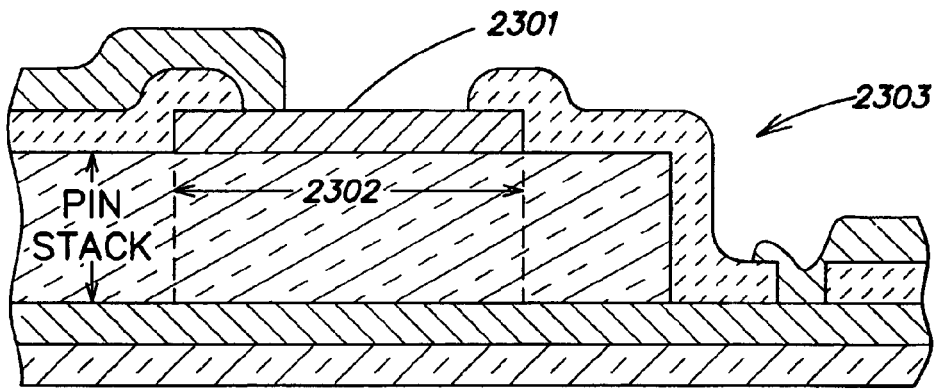
FIGS. 23, 24 and 25 are schematic cross-sections of PIN diode structures having limited active areas.

An example of the former is shown in FIG. 23. In this case, the top transparent conductive layer 2301 has been patterned to electrically contact a limited area 2302 in a large-area PIN stack 2303. The advantage of this structure is that it can be constructed using relatively simple processing. The disadvantage is that the top transparent conductive layer 2301 may be so thick as to form an edge that may not be bridged properly by the metal line-out. This can be overcome by careful conventional processing or by other structures described herein.

Examples of the latter include defining a masking layer of an insulating material either at the bottom or top surface of the PIN stack. An immediate advantage of this structure for confining the photodetector is that it maximizes the ratio of the optically active area to the electrically active one, which results in higher contrast between the photocurrent and the dark current in reverse-biased conditions.

Figure 24:
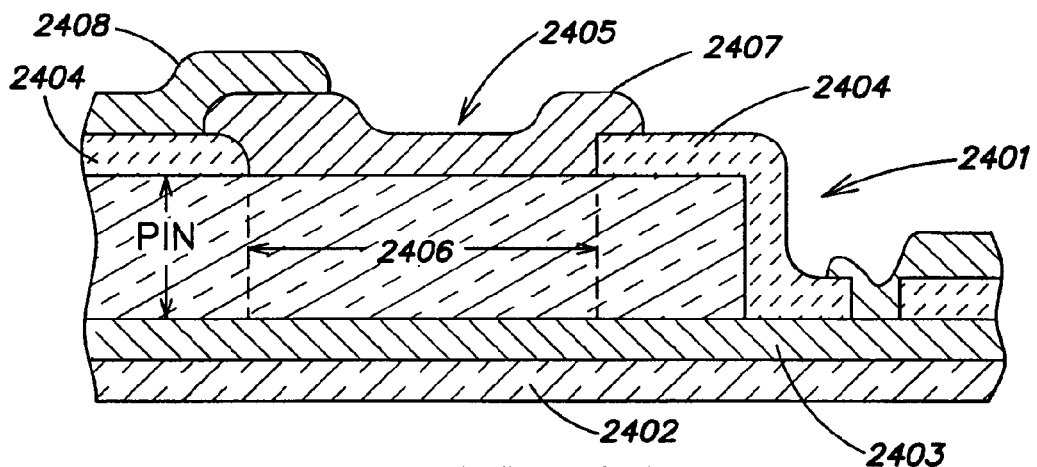

The top mask structure is illustrated in FIG. 24. In this version the entire stack 2401 is deposited on a substrate 2402 coated with a conductor 2403, which may be a transparent conductor 2403. Passivation layer 2404 is applied and a window 2405 is etched to define the active area 2406. The transparent conductive layer 2407 is applied over the window, overlapping the passivation layer 2404. Although there may still be a step for the metal line-out 2408 at the edge of the transparent conductive layer 2407, this is not problematic because it is a conductor-conductor contact and the contact made at the base of the transparent conductive layer 2407 structure will be sufficient.

Figure 25:
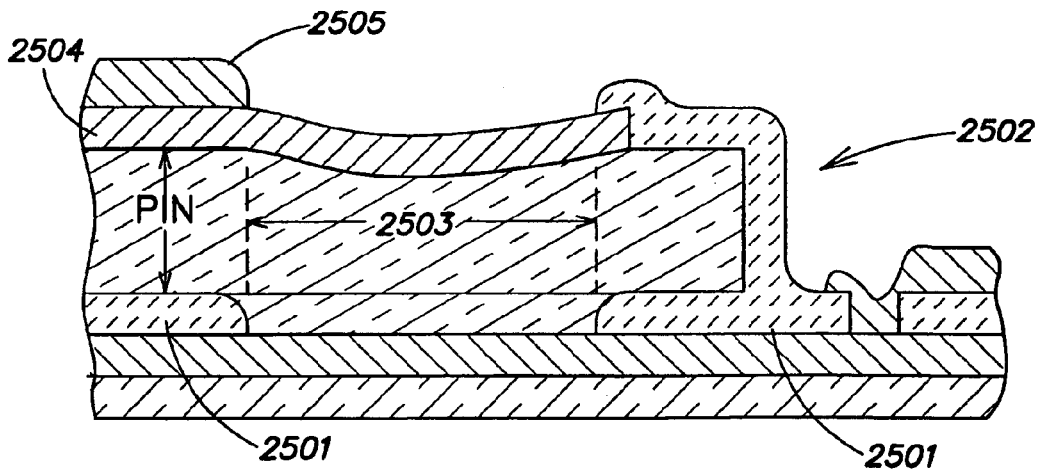

A presently preferred embodiment is shown in FIG. 25. Here a layer of insulator 2501 under the PIN stack 2502 defines the active area 2503 on the device 2502. The advantage of this configuration is that it allows a very smooth upper surface. Generally, the insulator 2501 is relatively thin compared to the rest of the stack 2502. Moreover the entire transparent conductive layer on the top layer 2504 can be extended to the contact pad (not shown), supplemented by a metal layer 2505 on top, if desired. A smooth top and bottom surface on the photodetector may also have benefits from an optical perspective because they introduce the least amount of deviation/spread in beam passing through detector.

The above described embodiments share a common benefit. They allow two-level structures for proper contacting while simultaneously reducing dark currents by removing the contacted PIN areas from the PIN stack edges. The result is a virtual elimination of the largest source of "noise" in a very small aperture detector, which is the current which runs down the edges of the PIN stack.

Making the Basic Structures

The edge passivation layer described above can be fabricated in two steps:

1. Deposition. This step is done either using well-known semiconductor fabrication methods, such as PE-CVD in the case where an inorganic insulator such as silicon nitride or silicon dioxide is used, or using one of several coating methods such as spin-on, already in use for an organic insulator such as polyimide. If an organic insulator is used, curing through elevated temperature or exposure to UV light may be used to set the layer.

2. Patterning. The layer may be patterned using standard photolithographic methods used in the semiconductor industry. For this step, only the type of etching used to remove the passivating layer from areas where it is unwanted, such as optionally the aperture of the PIN and the contact via to the bottom PIN contact used will differ across different materials.

The edge passivated structure that results is illustrated in FIG. 8, as described above.

After fabricating the passivating layer, the device needs metallization. Two metal traces are patterned in such a way that they contact the transparent conductor or, in the case where no transparent conductor is required, the top of the PIN stack through the aperture in the passivating layer on top of the PIN stack; and the bottom conductor through the via patterned in the passivating layer. The metal contacts correspond to the circuit wires drawn schematically in FIG. 1. The device is now protected significantly against edge currents and is ready to function as an optical power monitor for VCSELs and other devices.

Next, three methods of fabricating a semitransparent PIN photodiode with transparent conductors are described. The are described in the order of least to most complex, together with the advantages of each.

First, a method of making the structure of FIG. 9 is described.

1. Blanket-coat substrate 106 with bottom transparent conductor 105.
2. Deposit semitransparent PIN stack 101, 102, 103.
3. Deposit top transparent conductor 104.
4. Photolithographically pattern and etch top transparent conductor 104.
5. Use patterned top transparent conductor 104 as mask to etch PIN stack 101, 102, 103.
6. Deposit and pattern passivating/insulating layer 801.
7. Deposit and pattern metal contacts 901, 902 to top and bottom transparent conductors 104, 105.

Next, a method is described in which application of the top transparent conductor is done after passivation resulting in a slightly larger aperture, and the sides of the PIN stack potentially are electrically cleaner because a top transparent conductor is not present during patterning, resulting in lower edge dark currents. The steps for this process, which produces the structure of FIG. 10, are as follows:

1. Blanket-coat substrate 106 with bottom transparent conductor 105.
2. Deposit and photolithographically pattern the semitransparent PIN stack 101, 102, 103.
3. Deposit and pattern passivating/insulating layer 801.
4. Deposit top transparent conductor 1002.
5. Photolithographically pattern and etch top transparent conductor 1002.
6. Deposit and pattern metal contacts 1001, 902 to top and bottom transparent conductors 1002, 105.

To produce the structure of FIG. 11, the bottom transparent conductor 105 is patterned before the PIN stack 101, 102, 103 is deposited in order to (1) reduce stray capacitances and (2) reduce need for blanket-coating entire device with insulator. The resulting structure is shown in FIG. 11. The steps for this process are as follows:

1. Blanket-coat substrate 106 with bottom transparent conductor 105.

2. Photolithographically pattern the bottom transparent conductor 104.

3. –6 or 7. The remaining steps same as either method given above, depending on desired top transparent conductor configuration.

Note that these devices may be fabricated on a number of different substrates, including but not limited to (1) glass; (2) plastics such a polyimides; (3) the surface of wafers carrying surface-emitting light-emitting devices such as VCSELs; and (4) optical waveguides and fibers. Substrates such as glass and plastic sheets may be bonded directly to the wafer to form integrated devices, or to waveguides to form integrated power monitors. For the purpose of such integrated devices, the PIN devices of the present invention would be grown in arrays matching the pitch of surface light emitters on the wafer. If a flipped substrate is to be used, vias maybe formed through the PIN substrate to form the final contact to the PIN, and most likely to the top contact of the surface light emitter. This lead is usually joined with one of the PIN contacts to form a common lead.

The resulting devices are able to provide highly-integrated systems for measuring and controlling optical power output from light emitters such as VCSELs. They are able to provide an accuracy and compactness not seen in any product available on the market today. By using the fabrication methods described herein, these devices may be fabricated in a relatively low-cost, simple manner.

Next are described two distinct processes for building contact PIN photodiodes: first, a process which results in a structure of FIGS. 12 and 13 in which transparent conductors are used to sandwich the PIN stack and provide contact to the N-and P-layers of the PIN device; and second, a process in which the bottom transparent conductor is left off, such as where the combination of a small detector aperture and a semiconductor of reasonable conductivity, for example, microcrystalline or polycrystalline thin film, is used for the bottom layer of the PIN, as in FIGS. 16 and 17.

1. The conductor is deposited in one step following deposition and patterning of the bottom transparent conductor, the PIN stack, the top transparent conductor, and the insulating/passivating layer, as described above. The conductor is patterned to form an inside ring matching the aperture of the PIN detector, contacting the top transparent conductor on the edge where it is covered by the insulating/passivating layer, or, in an alternative construction, where it covers the insulating layer. The outer conductor is patterned in a crescent shape that leaves just enough space for a lineout from the inner ring. This outside crescent sits on top of a trench that has been patterned in the insulator, giving a contact to the bottom transparent conductor around the majority of the detector. In the resulting structure, as shown in FIG. 13, the bottom transparent conductor should be optimized for higher conductivity to compensate for a larger mean distance to carry current between the detector and metal conductor, and the top conductor should be optimized for optical properties. Note that this corresponds to previously established needs, as the optical properties of the top transparent conductor as an anti-reflective coating are already considered.

2. Devices lacking transparent conductor layers will depend partly on a very small aperture to ensure sufficient conduction of generated electrons to control circuitry. The ideal design for such a device relies on two layers of conductive metal to sandwich the PIN device. In this design, it is optimal to make the top and bottom conductor apertures roughly the same diameter, or slightly skewed to account for the anticipated spread of a beam passing through the device. The processing is as previously described. The bottom metal layer is deposited and patterned into a ring with a lineout first, then the PIN stack and the insulating/passivating layer, possibly with a top transparent conductor either between the PIN and the insulator or on top of the insulator, then the second, i.e., top, layer of metal deposited and patterned into a top ring with lineout. Note that holes in the insulator are opened up during patterning to expose any pads needed to contact the bottom of the PIN. One advantage of this two-layer metal structure is that the bottom layers of an entire array of devices may be interconnected easily under the insulating layer. The resulting structure is shown in FIGS. 16 and 17.

The above devices may either be patterned singly, or they can be built in arrays to match the spacing of light-emitting devices on a wafer, or of channel spacings in a waveguide. These arrays will generally have one common contact and separate lead-outs to control circuitry. Examples of such arrays including transparent conductors are shown in FIG. 15. Analogous arrays may be fabricated for two-layer metal structures.

Advanced Materials

A semitransparent microcrystalline silicon PIN further improves on the performance of amorphous silicon-germanium photodiodes used in near-infrared applications, such as monitoring communications laser output. The fabrication of PIN photodiodes from microcrystalline silicon allows the devices to operate yet longer wavelengths, without the negative effects experienced when raising the concentration of germanium in an amorphous silicon-germanium cell. In addition, a major concern in the communications industry is degradation of the device over long periods of time. It is known that amorphous silicon PIN cells suffer from light-induced photocurrent degradation as described by the Staebler-Wronski effect. Microcrystalline cells are not subject to this same degradation, and may therefore be used in communications systems without significant burn-in or fear for long-term stability. The result is a PIN photodetector that may be used with SLEDs to directly monitor optical output power while transmitting a majority of the light. Moreover, this PIN detector is capable of monitoring emissions wavelengths in excess of 850 nm, and suffering from little or no degradation due to light-induced defects. When compared to amorphous silicon-germanium cells, microcrystalline devices are fabricated with a thicker intrinsic layer due to lower overall absorption, which results in longer processing times, higher costs, and potentially higher mechanical stresses which could lead to device failure. A microcrystalline device, like its amorphous silicon-germanium counterpart, may be manufactured at low temperatures, making it compatible with a number of substrates of interest for VCSEL monitoring applications, including polyimide and the VCSEL wafer itself.

Even microcrystalline silicon suffers from a limit on the addressable wavelength. To further address this limit, a material with higher quantum efficiencies at wavelengths on the order of 1000 nm is desired.

With higher bandwidth in the laser power monitor, intelligent circuitry may be integrated to monitor and adjust the relative intensities of high intensity and low intensity emissions representing logic levels "zero" and "one", or an entire grayscale for display, imaging, and other applications. Amorphous and microcrystalline materials are limited by electron and hole mobility to provide relatively long response times. Such devices are fine for monitoring average optical power over relatively long, e.g., microsecond-scale, periods. For faster response times, however, different materials must be employed.

A faster device embodying the invention is a semitransparent PIN photodiode fabricated using polycrystalline silicon. Polycrystalline silicon PINs have higher bandwidths than their amorphous and microcrystalline counterparts, and in addition are able to generate adequate signals at higher wavelengths. The device now described is semitransparent to light emitted from a surface light-emitting device such as a VCSEL. Embodiments of this device could be manufactured at sufficiently low temperature as to enable fabrication directly on a VCSEL wafer. The overall light absorption of polycrystalline material is lower than in amorphous or microcrystalline material, necessitating a thicker intrinsic layer in the PIN device.

Figure 26:
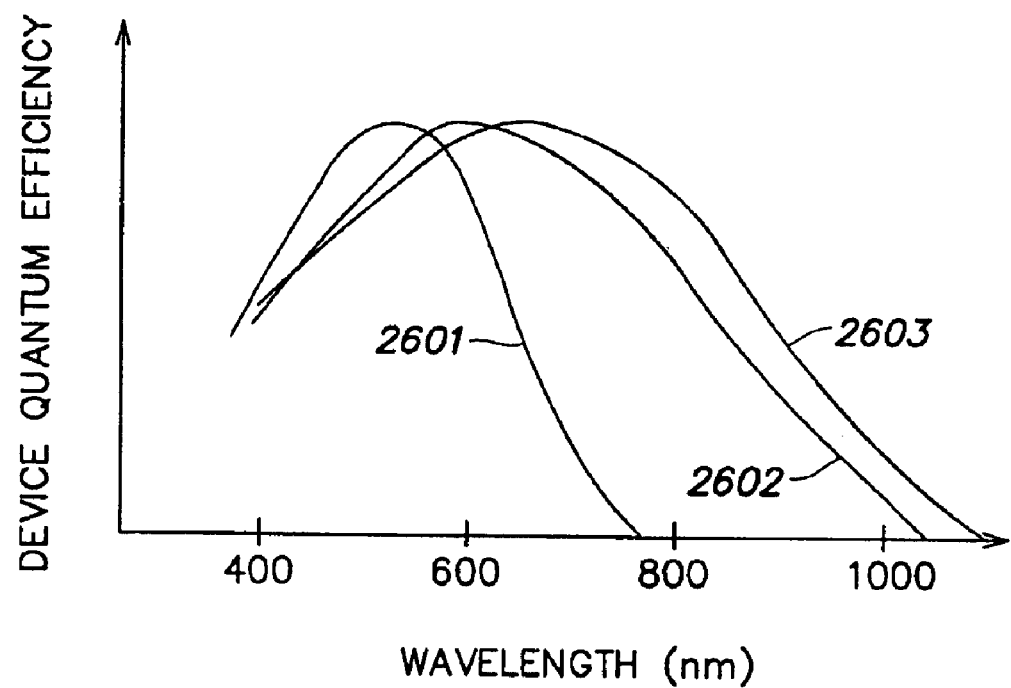
FIG. 26 is a graph of quantum efficiency versus wavelength for amorphous silicon, microcrystalline silicon and polycrystalline silicon.

The graph of quantum efficiency in FIG. 26 illustrates the relative performance of amorphous silicon 2601, microcrystalline silicon 2602 and polycrystalline silicon 2603.

No device based on a single, either crystalline or amorphous form of silicon has everything that is desirable in all layers of a semitransparent PIN photodetector. Microcrystalline and polycrystalline silicon, for instance, have lower absorption than amorphous silicon-germanium, and therefore thicker layers are required to achieve the desired responsivity. Besides higher costs and longer fabrication times, thicker films also are more likely to result in stresses in the PIN devices, possibly leading to failure during fabrication, testing, or operation. Amorphous silicon, on the other hand, is not desirable for the N- or P-layers of the PIN device precisely because it does absorb light, and additionally because it has very poor conductivity, and it is preferred that carriers generated in the I-layer be transported through low-resistance layers.

Combinations of different type of materials for the N-, I-, and P-layers of the PIN device, forming heterojunctions form devices with better overall function as semitransparent power monitors. The factors of performance, a tradeoff between responsivity, transmissivity, wavelength range, and stability, are determined on an application-by-application basis. The heterojunction devices described in the present invention have the ability to cover a large range of these applications for optical communications, optical storage, and other applications. These devices employ materials with higher conductivity and higher transmissivity for the N- and P-layers, and materials with higher absorption at the wavelength of interest for the I-layer. Specifically, micro- or polycrystalline silicon is used for the N- and P-layers, while amorphous silicon-germanium or microcrystalline silicon is used for the I-layer. The result is a cell that will be transparent to more light as emitted from a VCSEL or similar device at 850 nm or longer wavelengths, while maintaining photocurrent responsivity, thereby attenuating the optical power less, while providing a signal strong enough to guide laser driver electronics in adjusting average laser power. FIGS. 27, 28 and 29 show three examples of such PIN devices: in FIG. 27, microcrystalline bottom N- or P-layer 2701, amorphous silicon-germanium I-layer 2702, and microcrystalline top N- or P-layer 2703; in FIG. 28, polycrystalline bottom N- or P-layer 2801, amorphous silicon-germanium I-layer 2802, microcrystalline top N- or P-layer 2803; and in FIG. 29 polycrystalline bottom N- or P-layer 2901, microcrystalline silicon I-layer 2902, and microcrystalline top N- or P-layer 2903. The exemplary layer sequences are selected for process compatibility between the layers. For example, the order of recrystalized and amorphous layers is selected to avoid recrystalizing a layer desired to remain amorphous. In the case where the laser aperture is very small, and the PIN device may be moved very close to the laser, possibly fabricated directly on top of it. Polycrystalline or microcrystalline N- and P-layers may allow the elimination of the bottom, or both the bottom and top transparent conductors, thereby eliminating one additional barrier to light going through the detector. An example of such a structure is shown in FIG. 30, as follows. On a substrate 106, a patterned bottom metal layer 3001 is deposited. Bottom metal layer 3001 defines an aperture 3002. On the bottom metal layer 3001 is deposited an N- or P-layer 3003 of microcrystalline or polycrystalline silicon, an I-layer 3004 of amorphous or microcrystalline silicon-germanium alloy, and a P- or N-layer 3005 of microcrystalline silicon. Patterned top metal 3006 is then deposited.

Making the Advanced Materials

The semitransparent PIN device is fabricated using equipment such as that used to build amorphous silicon solar cells in large quantities. The preferred method of deposition is to use a plasma-enhanced chemical vapor deposition (PECVD) process:

1. Deposit a transparent conductor on a substrate that is transparent to the wavelength of interest as previously described. Because of the high hydrogen concentration used to form microcrystalline silicon, zinc oxide is preferred.

2. Without removing the substrate from vacuum during the following steps, and having the substrate at an elevated temperature, e.g., above 300° C., but as low as about 200° C. for sensitive substrates, throughout the process, perform the following steps to fabricate the semiconductor detector layers. To deposit microcrystalline silicon, high hydrogen dilution, e.g., >60% by volume, and increased DC or RF power should be used for all steps.

a. Deposit a relatively thin p-doped layer of amorphous silicon using commonly-known dopant such as boron.

b. Deposit a relatively thick intrinsic layer of microcrystalline silicon. The layer thickness should be larger than its amorphous silicon counterpart because the absorption of microcrystalline silicon will be lower.

c. Deposit a relatively thin N-doped layer of amorphous silicon using a dopant such as phosphorous.

3. Deposit a transparent conductor on top of the resulting PIN stack. This conductor serves as the top contact for the device.

The completed PIN stack is depicted in FIG. 3. Microcrystalline silicon-germanium alloys, used in such a structure, would further extend the wavelengths addressable by a semitransparent PIN photodiode.

The resulting device may be employed to monitor any light source up to roughly 950 nm or higher, even beyond 1,000 nm. The PIN described is used in similar configurations to those described above.

Three methods to fabricate the microcrystalline PIN photodiode of the present invention are now described.

1. Fabricate a hydrogenated amorphous silicon PIN stack, using a method known to one skilled in the art, such as a chemical vapor deposition process on a transparent conductor as described above. Then recrystallize in a processing furnace at high temperature, e.g., roughly 800° C. or higher while flowing forming gas including $H_2$ and $N_2$. Alternatively, rapid thermal annealing, in which high-intensity IR lamps are used to heat only the detector side of the substrate, may be used to recrystalize the detector structure in case of a sensitive substrate. Exposing the stack to an argon plasma before heating may aid the process of initial crystal formation, and reduces annealing time.

2. A polysilicon stack may be grown directly on the substrate and transparent conductor using high-temperature thermal CVD, also at roughly 800° C.

3. A hydrogenated amorphous silicon PIN stack, as described in the first method, above, may be laser-recrystallized. The advantage of this method is that a very short pulse may be used to recrystallize the stack in a particular spot, where the semitransparent PIN photodiode apertures will eventually be formed. The short duration of the pulse, and potentially varying absorptions for the recrystallizing laser wavelength allows the silicon stack to be heated to temperatures in excess of 800° C. while keeping the substrate at moderately low temperatures. This will enable a polycrystalline silicon PIN to be deposited on a low-temperature substrate such as polyimide, or potentially even then VCSEL wafer itself.

After the PIN stack is recrystallized, a transparent conductor is added to the top. The completed PIN stack is again as shown in FIG. 3.

The resulting device may be employed to monitor any light source up to roughly 950 nm. The particular advantage of the polycrystalline silicon PIN is that its bandwidth is sufficiently high to monitor optical power for certain applications such as imaging, for example in a VCSEL feeding into a retinal display. This will allow external or, eventually, integrated control circuitry to better control not only the average power, but also the slope of the power output of a surface-emitting light emitting device.

The three component materials used in the semitransparent heterojunction PINs described above are fabricated using well-known methods referred to in other disclosures. Hydrogenated amorphous silicon-germanium and microcrystalline silicon maybe deposited directly through PE-CVD. These components may be deposited at low temperatures. To form polycrystalline silicon layers, a precursor layer may be formed using a CVD process, and then the layer may be recrystallized using either bulk recrystallization (in an oven), rapid thermal annealing using an IR lamp, or laser recrystallization, which may be compatible with lower-temperature substrates such as polyimides or the VCSEL wafer itself. Examples of completed PIN stacks are shown in FIGS. 27, 28, 29 and 30.

Advanced Structures

Several more advanced structures for semitransparent optical monitoring are now described.

Figure 31:
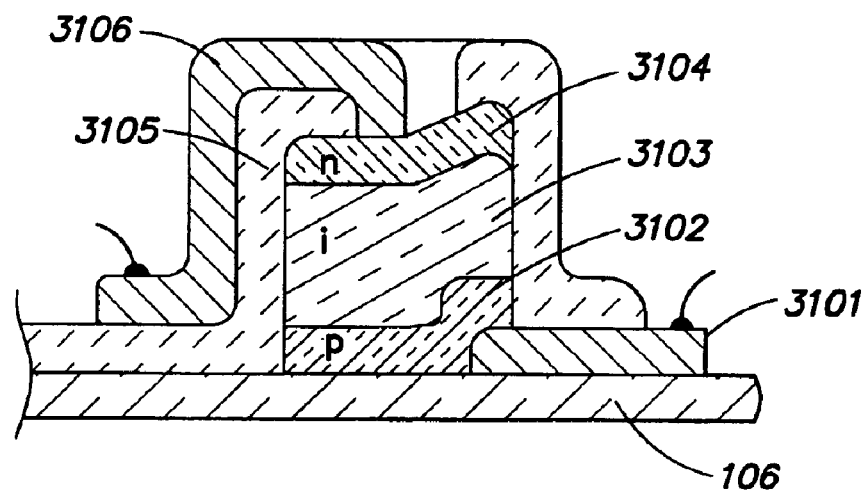
FIGS. 31 and 32 are schematic cross-sections of small aperture PIN diode structures.
Figure 32:
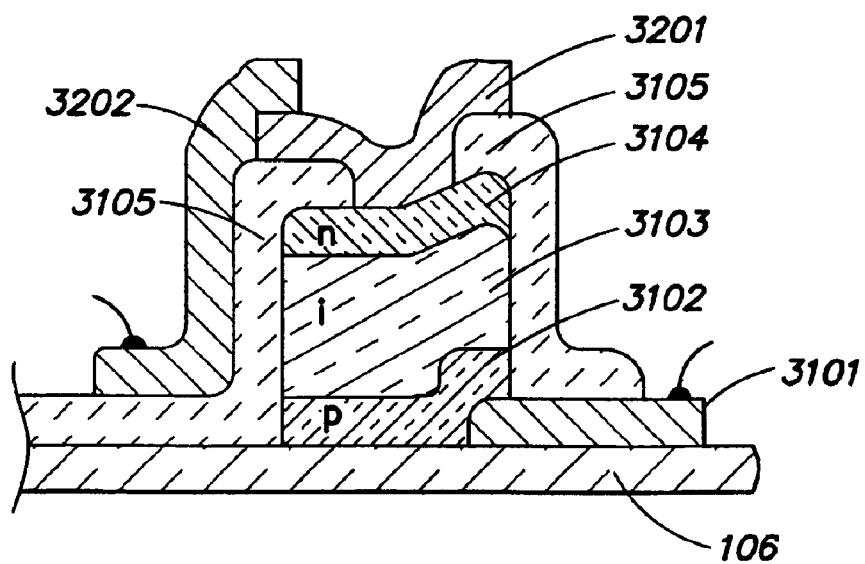

Advanced small-aperture PIN photodiodes, as shown in FIGS. 31 and 32 minimize fabrication steps and eliminates one or both transparent conducting layers from the semitransparent PIN device. The device relies on the enhanced conductivity of microcrystalline and polycrystalline silicon over their amorphous counterpart to transport charge over a short distance in the device's N- and P-layers. These layers are contacted directly to the metal lineouts used to interface to VCSEL power control circuitry, without the transparent conductor as described above. This device may include microcrystalline or polycrystalline layers either throughout the PIN device or at least for the top and bottom layers.

The structure of FIG. 31 includes, on a substrate 106, a bottom patterned metal layer 3101, the PIN stack 3102, 3103, 3104, a passivating layer 3105, and a top patterned metal layer 3106, deposited and patterned in the order given. FIG. 32 shows a similar structure, including the substrate 106, the bottom patterned metal layer 3101, the PIN stack 3102, 3103, 3104 and the passivating layer 3105. This structure further includes a top transparent conductor 3201, followed by a top metal layer 3202.

Figure 33:
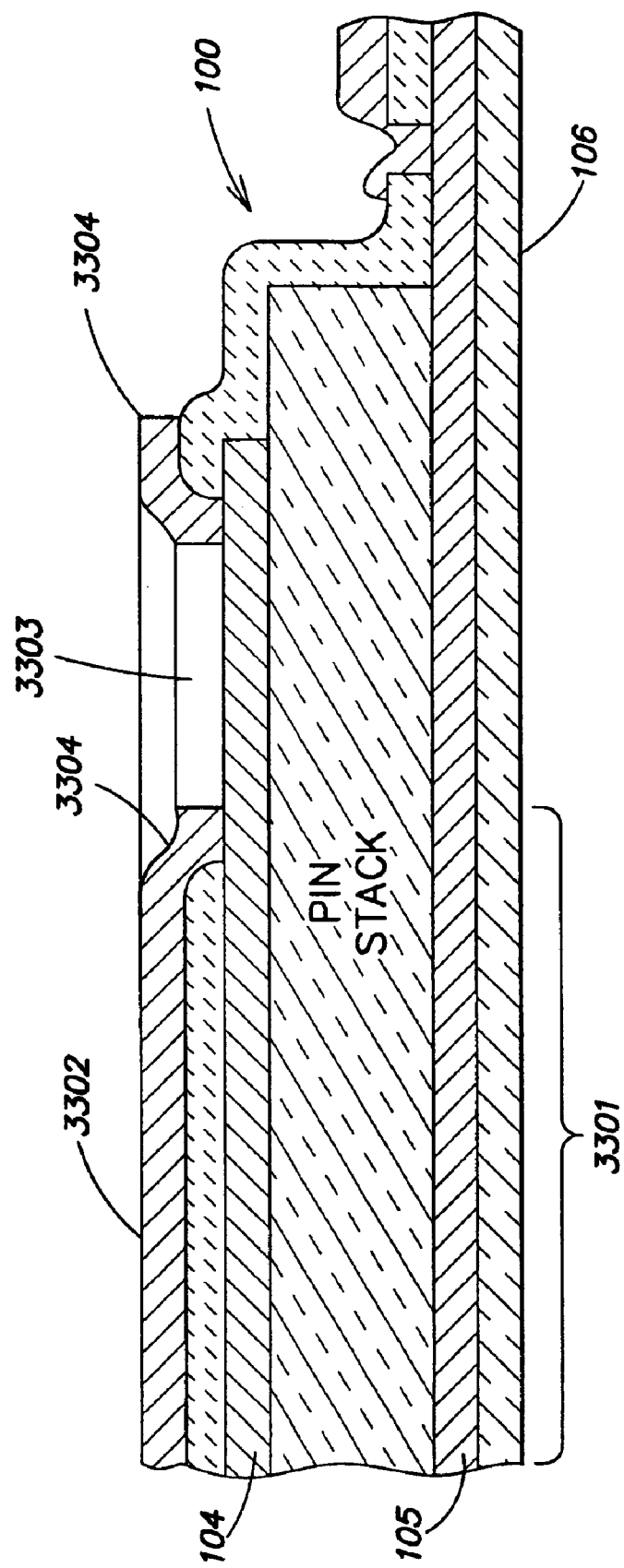
FIG. 33 is a schematic cross-section of a PIN diode structure having a planar lineout geometry.

A two-level lineout and contact pad structure for tall microelectronic structures reduces connection problems in advanced devices. Specifically for PIN photodetectors, as shown in FIG. 33, the entire PIN structure can be extended 3301 under the lineout 3302 and the contact pad (not shown) in order to establish a level plane on which to deposit the metal lineout 3302 using a sputtering technique. The photodetector function remains the same, since the detector aperture 3303 is defined by the inside ring contact 3304. The advantage of this structure is that very tall photodetectors can be built in order to increase photocurrent at long wavelengths, and bottom and top line-outs may still be deposited and patterned in one step.

Making the Advanced Structures

These devices are made by the methods already described herein.

While the bottom transparent conductor is difficult to select and tune, and therefore eliminating it yields substantial advantages, the top transparent conductor is in fact easier to fabricate using common indium tin oxide (ITO), and may in fact be desirable as an antireflective coating.

Note that these devices may be fabricated on a number of different substrates, including but not limited to glass, plastics such as polyimides, the surface of wafers carrying surface-emitting light-emitting devices such as VCSELs, and optical waveguides and fibers. Substrates such as glass and plastic sheets may be bonded directly to the wafer to form integrated devices, or to waveguides to form integrated power monitors. For the purpose of such integrated devices, the PIN devices of the present invention would be grown in arrays matching the pitch of surface light emitters on the wafer. If a flipped substrate is to be used, vias maybe formed through the PIN substrate to form the final contact to the PIN, and most likely to the top contact of the surface light emitter. This lead is usually joined with one of the PIN contacts to form a common lead.

Construction of Integrated Devices

A highly effective method of reducing series resistance and lowering device size in order to achieve manufacturing economies is to move the detector as close as possible to the laser. A smaller beam area incident on the detector means a shorter distance to good conductors. This may be used to further reduce series resistance; or use less-conductive contacts on the semitransparent area in order to reduce process steps or to increase transmissivity.

In the embodiments next described, PIN photodetectors are integrated with light sources, whether it be a surface light emitter like a VCSEL, or the edge of a waveguide carrying an optical signal at large scale in any of a number of fashions. The primary advantage of a direct integration step is that it minimizes the distance between the small-aperture light source and the detector, which also minimizes the detector aperture. Another very practical benefit is that such integration might occur at the wafer scale, so that thousands of devices might be integrated simultaneously, dramatically reducing costs below current piece-by-piece PIN-light source integration processes. Finally, testing may be performed at this large scale, and integrated devices sorted before further expensive processing.

Substrates for PIN photodetectors include crystalline silicon and glass. Glass has been used extensively, for instance, in x-ray detector arrays.

Semitransparent PIN photodetectors can according to this aspect of the invention, be made on a flexible substrate in order to allow for easy integration with packaging, electronics, waveguides, and of course the VCSEL wafer. The viability of electronic devices built on such substrates for reducing package size has been extensively demonstrated in hearing aids, where polyimide printed circuits are used as integrated circuit substrates. In terms of integration with a VCSEL wafer, a flexible or compliant PIN substrate eliminates the need for an additional interfacing layer, and may simplify interconnections. In addition, direct bonding of such a substrate with the VCSEL wafer will reduce the number of layers that must be sawed over other integration schemes, and most likely improve overall device yield due to fewer alignment, stress, interconnect, and dicing issues. The PIN stacks can be produced directly on a flexible substrate which may then be integrated, or diced, then integrated, with any number of devices. Certain substrates often used in electronics manufacturing, such as Dupont's Kapton™-brand polyimide have been used extensively to provide printed circuit layers complete with layer-interconnection vias. One of these materials, for example high-temperature plastics, can be used as the substrate. Kapton™ is also transparent to the wavelengths of interest, up to roughly 900 nm. Finally, certain plastics such as Kapton™ have been used to build planar waveguides. Thin-film semiconductor devices such as semitransparent PINs and other circuit elements could be integrated directly with a communications waveguide of Kapton™.

We have previously described a number of methods of fabricating thin-film PIN devices for semitransparent optical power monitoring applications. High-temperature plastics may withstand processing temperatures of up to roughly 300° C. (certain plastics are advertised to 400° C.), and functional arrays of devices such as transistors on polyimide foils as thin as 50 microns have been deposited by the same methods as described above. Plastics with transparent conducting and metal coatings are commercially available, clearly demonstrating that the first step of all the proposed processes is viable and even simple. The present invention is the first known example that integrates semitransparent PIN detectors with such a substrate. The excellent mechanical properties of such a substrate should open up a wide variety of applications for such devices in optical communications and imaging.

The resulting devices may be used in a number of manners. They may be directly integrated with optoelectronic devices such as VCSELs by connecting them directly; alternatively, the PINs may be integrated as part of other optoelectronic packaging, since a plastic substrate is ideal for such merging. Finally, the plastic substrate itself may be used as a substrate for electronics, using technology like 3M's flex circuits, or as part of an optical waveguide using a technology such as Dupont's Polyguide™.

The creation of an integrated light-emitting/power monitoring device has been a long-term goal, particularly in the optical communications industry. To date no group has demonstrated a solution that can be manufactured and tested at the wafer scale. Practical barriers to such an integrated device have been the lack of a reliable, effective semitransparent photodetector; the sensitivity of the VCSEL wafer to additional processing, particularly when it involved high temperatures; the mismatch of conventional photodetector substrates with the VCSEL wafer; and the high potential cost, in terms of reduced yield, that additional steps might incur on a VCSEL wafer.

Figure 34:
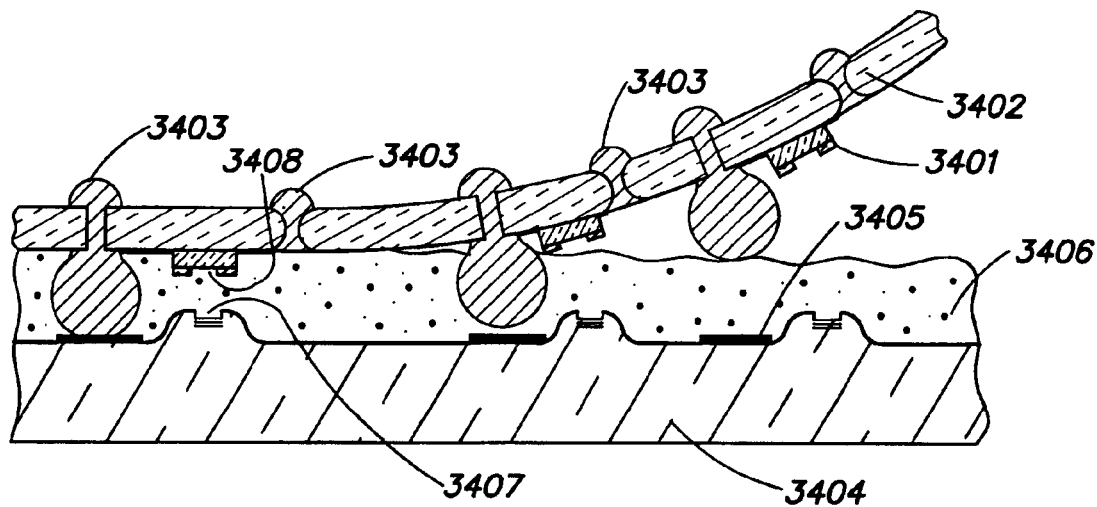
FIG. 34 is a schematic cross-section illustrating flip bonding a flexible substrate carrying semitransparent PIN diodes to a VCSEL wafer.
Figure 35:
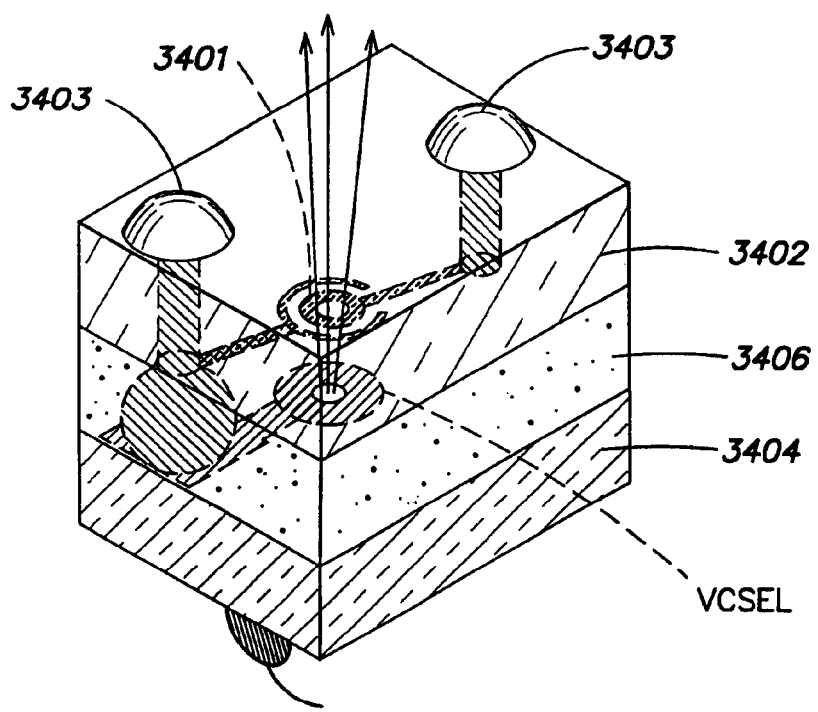
FIG. 35 is a schematic perspective view of a single finished flip bonded device.
Figure 36:
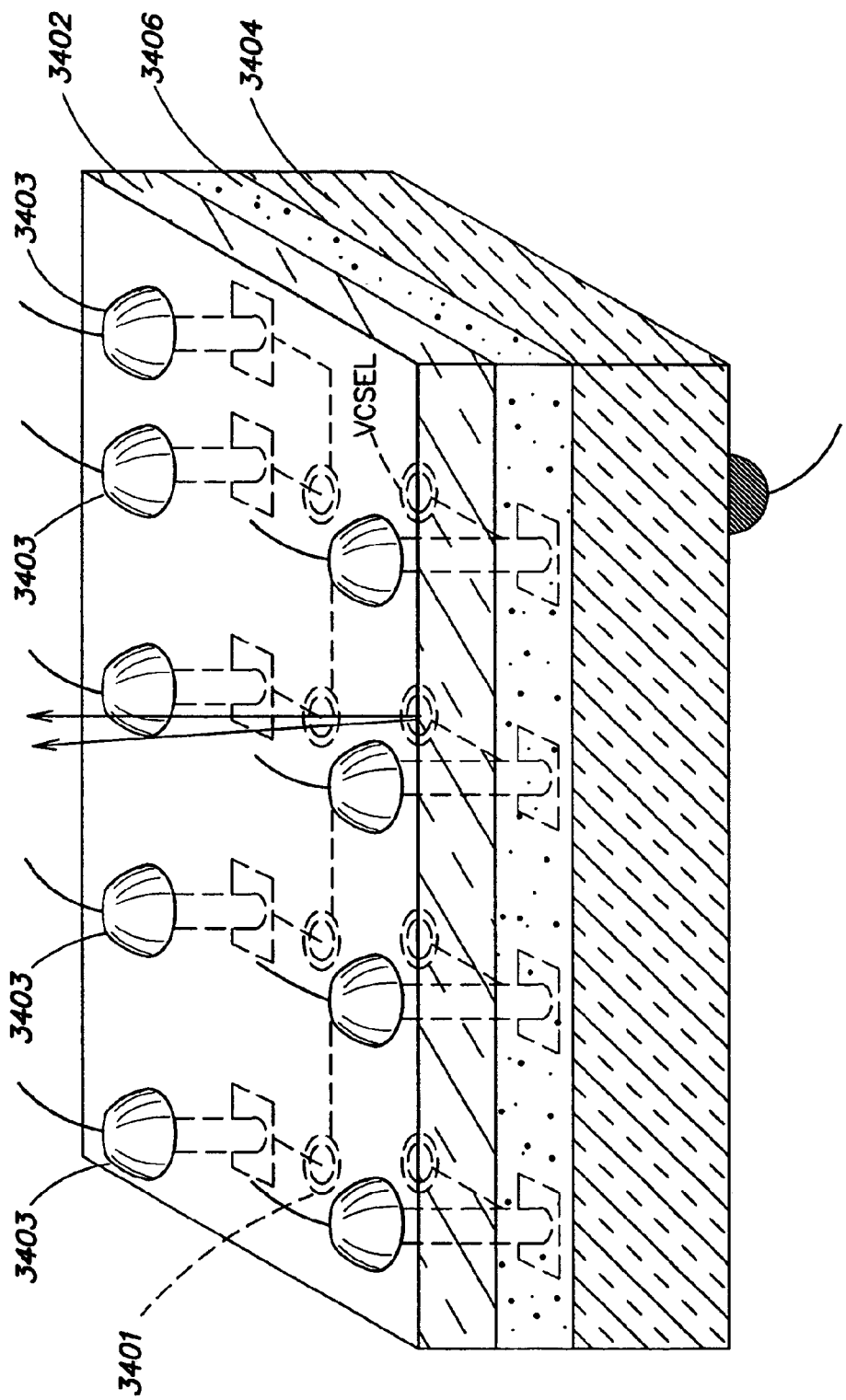
FIG. 36 is a schematic perspective view of a finished array of flip bonded devices.

According to some embodiments of the invention, an integrated optical power monitoring system for use with surface-emitting light emitters takes advantage of the above-described semitransparent thin-film photodetectors. Furthermore, these devices can be fabricated on flexible, compliant, and transparent substrates such as polyimide foils. According to this aspect of the invention, semitransparent PIN photodiodes and appropriate lineouts are fabricated on a flexible plastic substrate, then the resulting array is bonded to the wafer on which the surface-emitting light-emitting device is formed using bump-bonding and an optically-transparent adhesive substance such as optical epoxy. Vias are formed through the flexible substrate to the metal contacts to the PIN and to the top contacts, or the solder ball that makes contact with the top contacts on the surface-emitter wafer. Finally these vias are filled with a conductor and top contacts are formed on the flexible substrate. This is of course one of the many ways such a substrate may be integrated with a wafer. Many methods for drilling vias, bump bonding, and flip-chip bonding are known and/or in use. Bonding, a single finished device, and a finished array are shown in FIGS. 34, 35, and 36, respectively.

As a first step in manufacturing integrated VCSEL/PIN systems (or similar systems integrating another type of surface-emitting light source), PIN devices 3401 should be formed and contacted on a flexible substrate 3402 as described above.

Upon completion of this step (and potentially burn-in and testing, as described below), a form of solder bumping 3403 could be used on either the PIN substrate 3402, the VCSEL wafer 3404, or both. These bumps 3403 will form the contacts to the VCSEL surface 3405, and potentially the common leads for the PIN and VCSEL. The PIN substrate 3402 is then aligned with and bonded to the VCSEL wafer 3404 in such as way as to line up the VCSEL apertures 3407 with the PIN apertures 3408. The PIN apertures 3408 may be sized according to the accuracy of this flip-bonding step. The pre-deposited solder bumps 3403 form contacts between the surfaces, while an adhesive such as an epoxy 3406, which should be transparent to the wavelength of interest, and should be optically matched to both the VCSEL aperture 3407 and the PIN aperture 3408 is used to bind the two surfaces together. After curing of the adhesive, vias may be drilled through the flexible PIN substrate and possibly the cured adhesive to make contact to the front VCSEL contact and the PIN contacts. The drilling process is arrested by the metal pads formed on the PIN side of the flexible substrate, or the top metal contact on the VCSEL wafer surface. Finally, these vias are filled or coated with conductor; the vias may either be connected to pre-formed metal traces on the rear side of the flexible substrate, or solder pads may be used directly as the contact for wiring, or, in a more complex system, the entire integrated device may now be flipped on to a waveguide or other transparent surface with pre-patterned contacts. It should be noted that the possibilities for the preceding steps are nearly endless because they have been extensively refined in various other applications.

According to the following method an oversized array of PIN devices is formed on a substrate in such a way that the PIN devices may be tested, either completely or through statistical sampling, and then a portion of the PIN array is bonded to a VCSEL wafer in such a way as to maximize yield and performance of the integrated devices. The oversized arrays may even be of such size that they can be used for more than one VCSEL wafer. Thin-film processes for 8" wide substrates are already common. With an 8"×8" substrate, it is theoretically possible to build 16 integrated VCSEL/PIN wafers based on 2" wafers, as used by some VCSEL manufacturers today. Alternatively, fewer integrated wafers could be built, but yield and performance maximized by test-based area selection on the substrate. This process allows a steady cost tradeoff between PIN yield and integrated VCSEL/PIN yield, and is particularly beneficial as a process is being first implemented, when yield generally starts low for a new process/plant and then is boosted through experience and tuning. An example of a manufacturing flow incorporating burn-in and testing steps is as follows:

1. Fabricate PIN substrate on flexible substrate.
2. Form contact bumps on the PIN substrate.
3. Burn in PIN substrate under appropriate conditions in light intensity, temperature, and reverse bias set as determined by experiment.
4. Test PINs, either each one or through statistical sampling, to determine properties and yield for different areas on the PIN substrate.
5. Cut out best area(s) from substrate.
6. Flip bond these areas with the VCSEL wafer.
7. Perform laser drilling of vias and/or any other contact processing needed.
8. Burn in combined devices at wafer scale>
9. Test all devices for optical and electrical properties.
10. Dice, select, and package integrated VCSEL/PIN devices.

The potential applications of an integrated light emitter/optical power monitor are myriad. Indeed such a device is contemplated to replace the current solution of using a backreflection monitor. In addition, it opens up the possibility of monitoring power emitted by 1- and 2-dimensional arrays of devices such as VCSELs. The present invention allows simple integration at the wafer scale, leading to wafer-level burn-in, testing, and measurement of integrated devices. Thus chip-size devices can be delivered with precise specifications of power output and integrated photodiode response. A volume manufacturing process based on the device and general processes described in the present application will result in optical power monitors that have extremely consistent responsivities, allowing OEMs to integrate these devices without any calibration or alteration at all. At this point the cost of integrating compact, reliable devices for optical communications or other applications will fall dramatically.

Among the applications of such integrated devices are optical communications modules that abut directly on the waveguide, either permanently or through a plug-in, plug-out connector, transmitters or transmitter arrays that are flipped directly on to planar optical waveguides, and of course replacements for current VCSEL/backreflection photodiode systems.

Integrated power monitoring devices with VCSELs or similar devices have not yet been commercialized because of at least two factors: (1) the difficulty of producing a thin-film photodetector with adequate photoresponse and low dark current that also transmits a majority of the light being emitted by the VCSEL; and (2) the relatively high temperatures at which conventional thin-film processing is performed combined with the VCSEL wafer's sensitivity to high temperatures. Processed VCSELs are sensitive to high temperatures, primarily because of the large number of layers that make up their internal reflectors. At each of the interfaces within the VCSEL there is already an inherent strain due to crystal lattice mismatches. These strains are aggravated by large temperature swings, actually demonstrable by the change in laser output as temperature rises. VCSEL manufacturers have indicated 200–300° C. as a maximum for follow-on processing on a VCSEL wafer. The majority of the fabrication methods described above can be implemented using low-temperature techniques, thereby enabling direct integration with VCSEL wafers.

Figure 37:
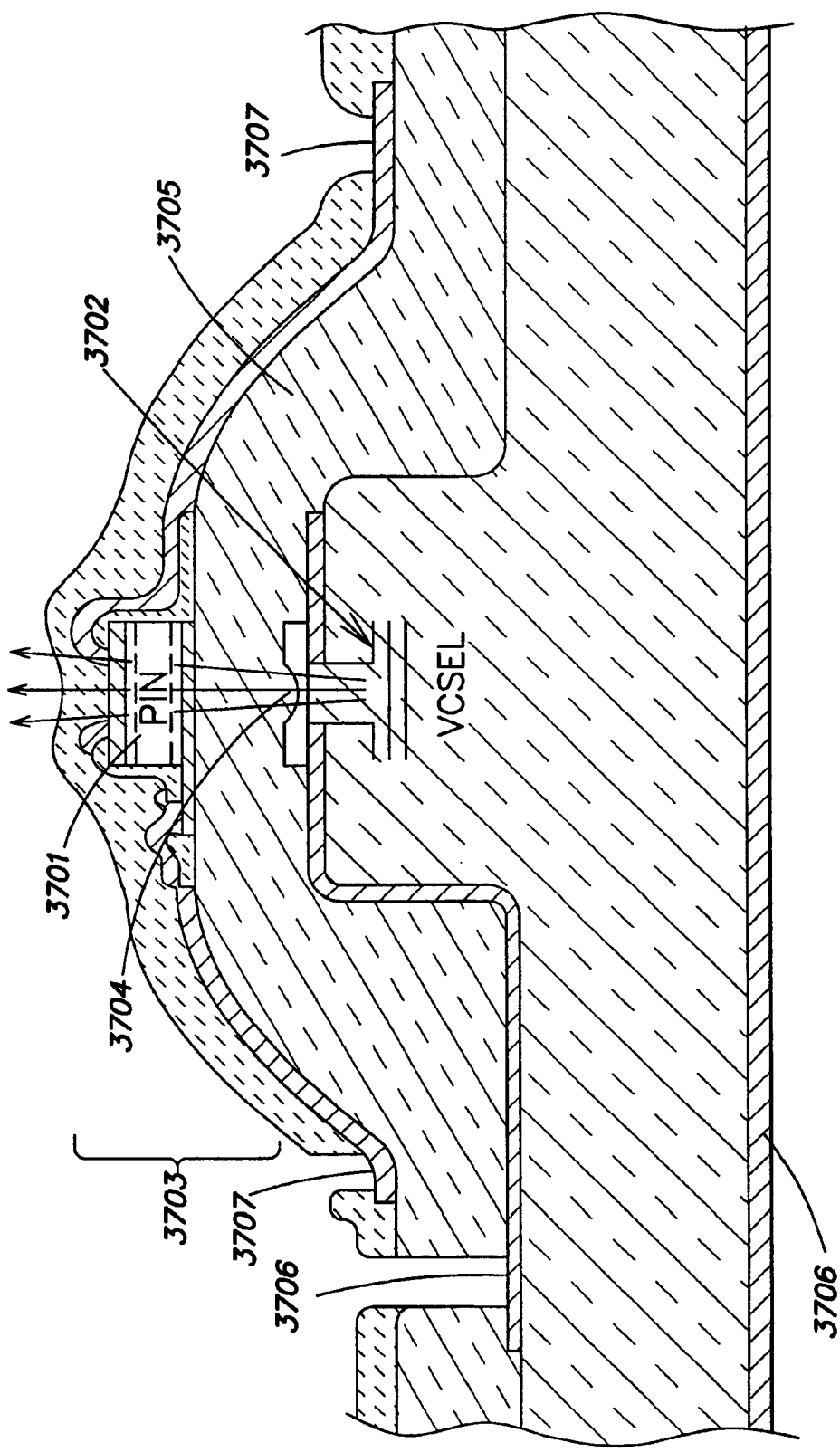
FIG. 37 is a schematic cross-section of a fully integrated light source and semitransparent PIN diode optical monitor.

The semitransparent photodetector should be built, as shown in FIG. 37, in such a way as to reflect a minimum amount of light back into the VCSEL aperture to avoid negative interactions with the laser itself. This means that the detector 3701 should be positioned in such a way that it minimizes optical interaction with the VCSEL 3702; and the thickness and index of refraction of layers 3703 between the VCSEL aperture 3704 and the top of the photodiode should be selected in such a way as to minimize reflectance. The semitransparent photodetector 3701 could also be purposely built as a resonant cavity in tune with the VCSEL. This, however, involves much more tuning and will result in a more expensive manufacturing process. Therefore, the exemplary device has a relatively thick layer 3705 between the VCSEL 3702 and the PIN detector 3701. This layer 3705 reduces the optical effects mentioned above, forms a substrate for the PIN device 3701, acts as an insulator between VCSEL and PIN contacts 3706, 3707, and reduces the capacitance induced by the layering of devices, which may be an important determinant of VCSEL switching speed.

The processing steps for such a device, shown in FIG. 37 are given below. There are many potential methods of achieving the same result, several of which are described above. The steps are as follows:

1. On the VCSEL wafer, coat a relatively thick, relative to the thickness of the PIN device, and to the wavelength of interest layer of a transparent insulator such as silicon nitride or silicon oxide.
2. PIN devices should be formed and contacted on the insulator as described above, but where the substrate is the transparent insulator.
3. A via should be formed through the transparent insulator/substrate to the top VCSEL contact. In one embodiment, this is done before the metal layer is applied to the PIN, and one of the PIN contacts is connected to the top VCSEL contact to form a common lead.
4. A top protective layer should be applied, as is common with semiconductor devices, and vias formed to the contact pads for the PIN and the VCSEL.

Among the applications of such integrated devices are optical communications modules that abut directly on the waveguide, either permanently or through a plug-in, plug-out connector, transmitters or transmitter arrays that are flipped directly on to planar optical waveguides, and of course replacements for current VCSEL/backreflection photodiode systems.

A major drive in the optical communications industry has been to reduce the package size of optical transceivers in order to fit more ports on to each board, rack, or switching/routing unit. In addition, the implementation of optical backplanes for switches, routers, servers, and supercomputers has been limited to some extent by the compactness (or lack thereof) of current transceiver packages. This problem will be exacerbated as link speed requirements rise and interconnections are increasingly user-friendly, so that a relatively untrained IT technician may plug-n-play. Optical power monitoring for better tuning of threshold levels and user eye safety will no longer be optional. In addition to currently-used interconnects, parallel architectures are proposed and even in limited use. With current technologies, this will mean bulky transceivers that eat up more board space.

Figure 38:
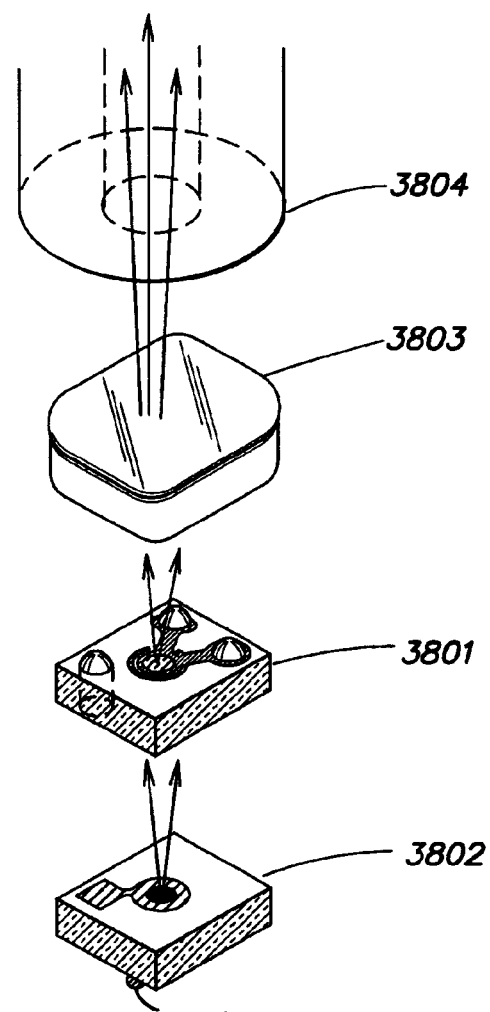
FIG. 38 is an exploded view of an integrated light source and optical monitor.
Figure 39:
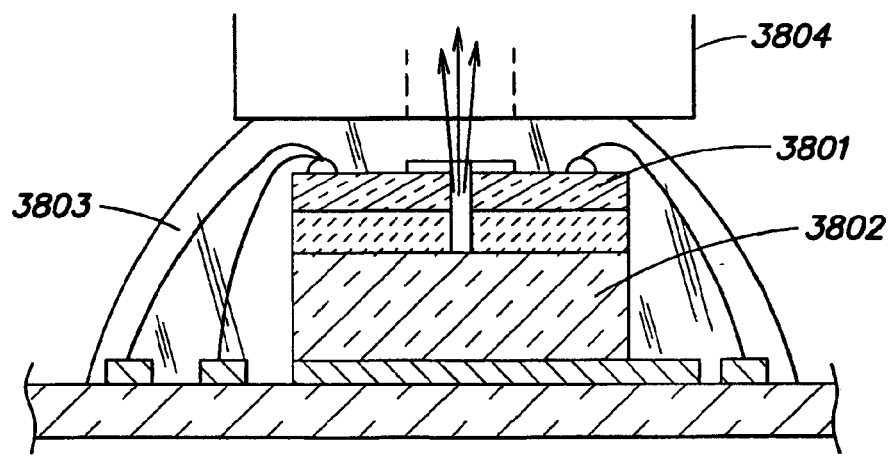
FIG. 39 is a schematic cross-section of the integrated light source and optical monitor of FIG. 38.

VCSELs or VCSEL arrays can be directly interfaced with waveguides, using semitransparent optical power monitors as an intermediate layer to control VCSEL output power. The total thickness of the resulting package can be thin enough that the majority of the VCSEL beam, after passing through the optical power monitoring layer, enters the core of the waveguide at an appropriate angle. Where the VCSEL divergence angle is high or the waveguide core diameter is particularly small, as would be the case with a singlemode fiber, additional flat optics may be used to guide light into the waveguide; our focus, however, is on multimode systems operating at wavelengths under roughly 1000 nm where the core diameter is relatively large and no additional optics must be integrated. If a lens must be integrated, it may be beneficial to do this using a graded-index lens which can be constructed in a flat package. Commercially-available VCSEL chips have beam divergences of under 20°, and as low as 10°. In its most basic implementation this aspect of the present invention consists of three layers closely packed together: (1) a VCSEL or VCSEL array; (2) an semitransparent optical power monitor such as a PIN photodetector, and (3) a waveguide such as an optical fiber or a planar polymer waveguide. The components may be in several configurations. Examples of a few include: (1) semitransparent optical power monitor 3801 fabricated directly on, or flip-bonded to, the VCSEL 3802 or VCSEL array and covered with a transparent protective coating 3803 which is polished and interfaced to a waveguide 3804, as shown in FIG. 38, which is potentially connectorized in such a manner is to be easily pluggable, (2) semitransparent optical power monitor fabricated directly on the waveguide aperture, with the VCSEL or VCSEL array flip-bonded onto the waveguide for a permanent connection, as shown in FIG. 39. Several other configurations are potentially possible; all will have the form of a stack of closely-packed components including a VCSEL, a semitransparent optical power monitor, and a waveguide arranged in such a manner that the majority of the light emitted by the VCSEL and passed through the optical power monitor reaches the effective area of the waveguide.

Figure 40:
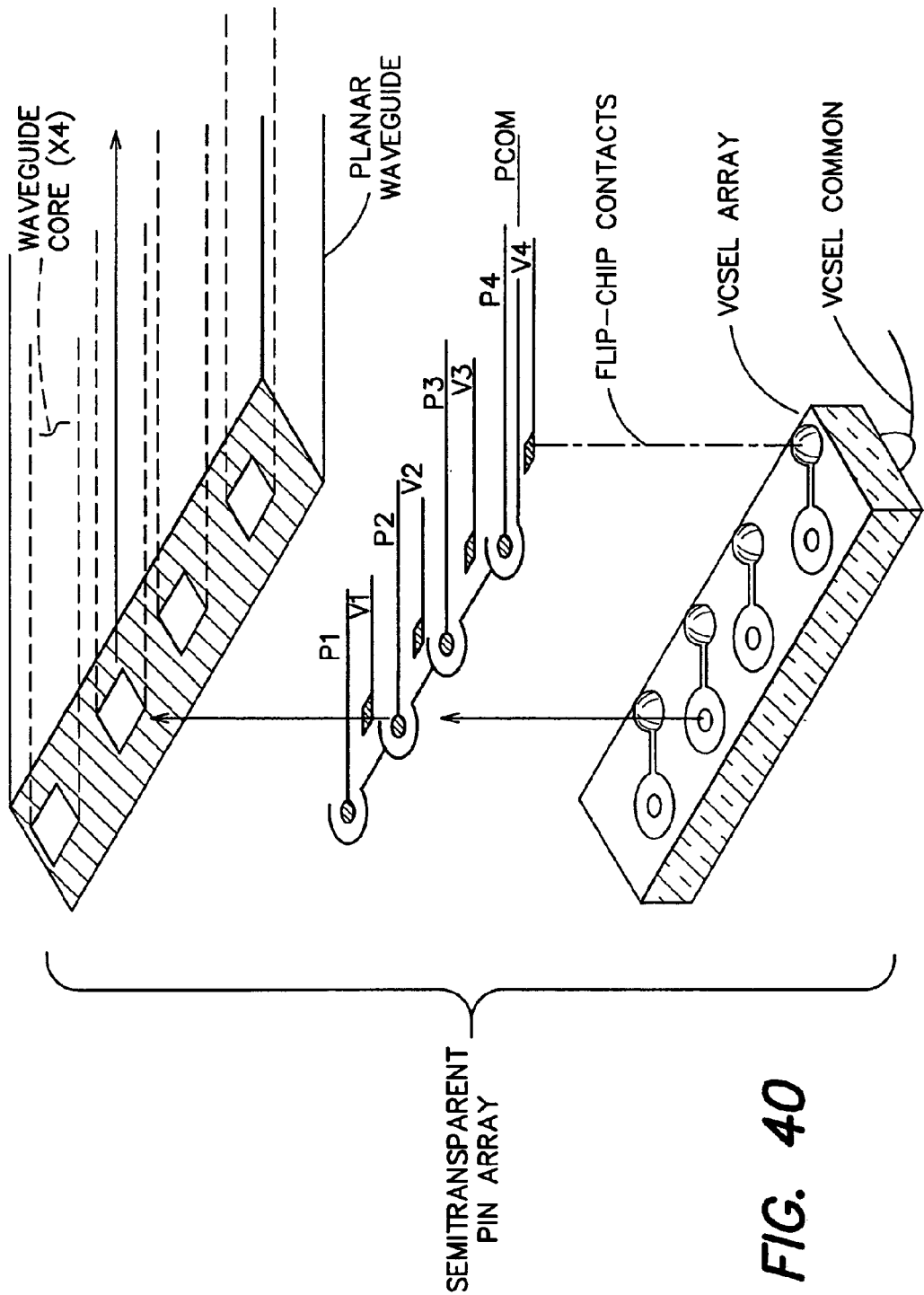
FIG. 40 is an exploded view of an integrated light source, optical monitor and planar waveguide array.
Figure 41:
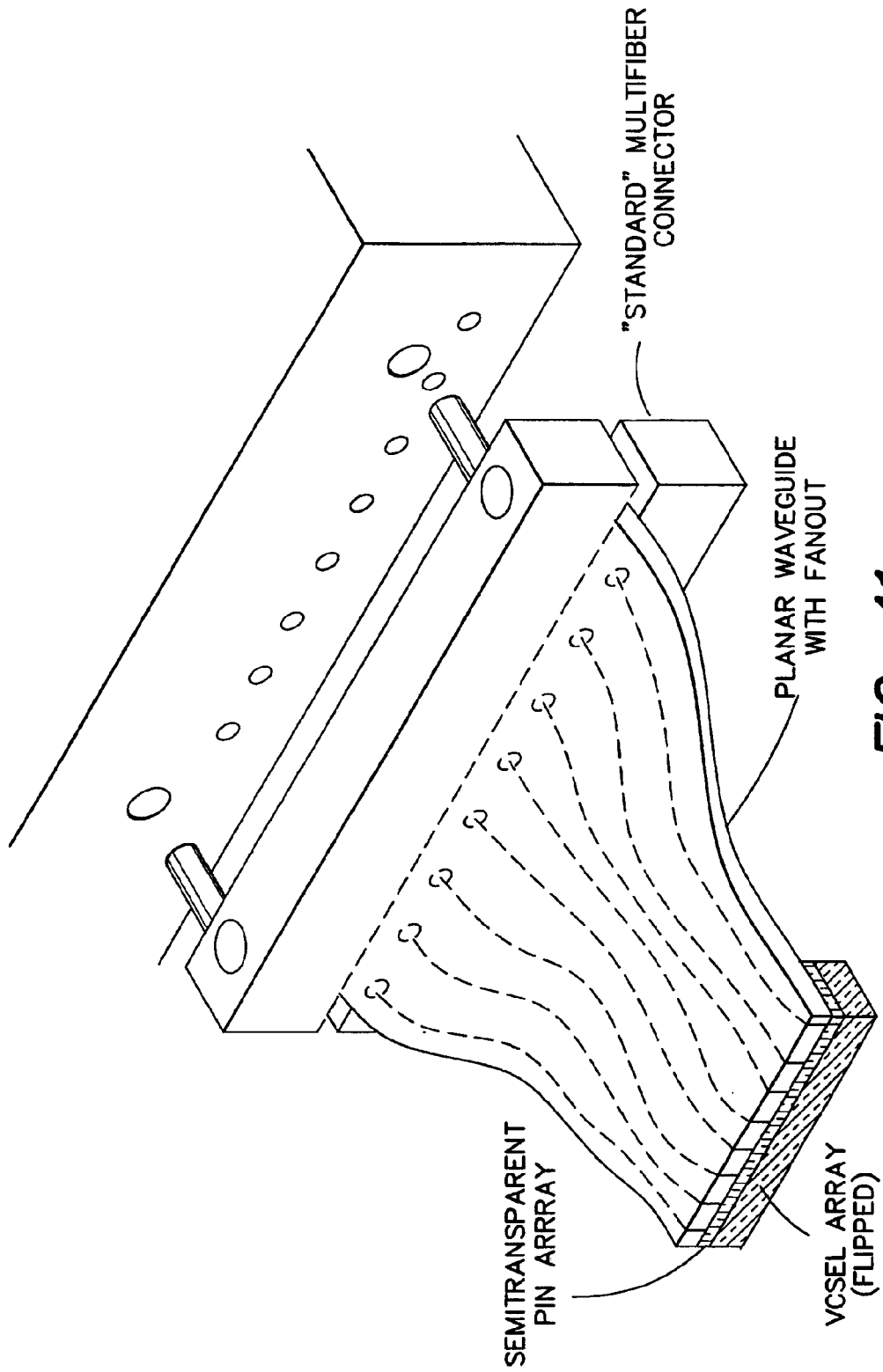
FIG. 41 is a perspective view of a light source array with optical monitoring and standard connector.
Figure 42:
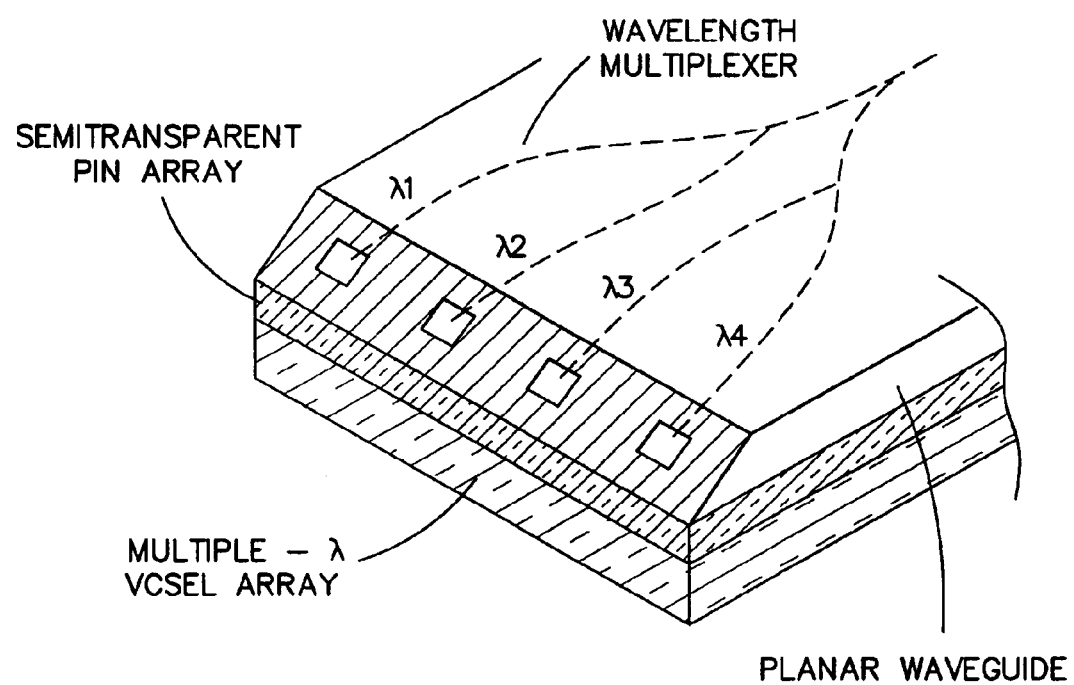
FIG. 42 is an integrated light source, optical monitor and waveguide array.

Many options for manufacturing and packaging this embodiment of the present invention exist. An integrated package generally requires a certain amount of electrical, optical, and mechanical bonding, which are best achieved, as detailed above using optical epoxies and well-known flip-bonding techniques. FIG. 40 shows one potential implementation where the integrated VCSEL-PIN photodetector package has been manufactured using the processes described above. The resulting diced unit, either in single-VCSEL or VCSEL array form is mounted on a substrate for wirebonding. The substrate may additionally contain some of the required drive electronics. The assembly is then wirebonded, and encapsulated in a clear protective coating, which after curing is polished to provide a good optical interface surface for a fiber or other waveguide. The assembly is shown in FIG. 41. An alternative version is shown in FIG. 42, where the semitransparent PIN detectors are fabricated directly on the planar waveguide. As described above, detectors according to various aspects of the invention can be fabricated directly on the type of plastics, polyimides, used for constructing such waveguides, where they may be integrated with other conductor patterns used to connect VCSELs to drive electronics. The bare VCSEL array die is then flip-bonded to the waveguide such that the emitted light passes through the PIN detectors. This process allows for potentially more extensive passive and active electronic circuits to be fabricated over relatively large areas on the surfaces of the planar waveguide. It should be kept in mind while fabricating these integrated devices that a they take advantage of thin layers to minimize the distance between the VCSEL aperture and the waveguide core; a first-order formula for the maximum distance to be maintained used by the inventor is shown in FIG. 21. A second-order formula will operate by the same principle, but will take into account the refractive indices of the layers between the VCSEL and the waveguide (including those components themselves).

Several systems in which VCSELs are interfaced directly with waveguides have been proposed to date. In particular, high-speed optical interconnect systems based on laser arrays have been developed and prototyped, but generally have yet to see large-scale implementation, to a great degree because of the difficulty in individually controlling laser power in an array using currently-available power monitoring techniques. In fact, it is currently nearly impossible to directly monitor the optical power of each individual channel. The various embodiments of the present invention provide for such direct control in integrated systems. One application is the formation of parallel optical links based on arrayed VCSELs. The advantage of this construction is that a single VCSEL chip may be used, significantly reducing the cost of bonding, wiring, and packaging. However, the spacing of the VCSELs is generally very small, much smaller than fiber spacing in multi-fiber connectors. One highly-desirable method for achieving the fanout from the VCSEL array pitch to a standard connector pitch is through the use of a planar waveguide built from something such as Dupont's PolyGuide™ technology. The waveguide is formed with a cleaved edge so as to reflect light arriving perpendicular to its plane (from a flipped VCSEL array) into rectangular waveguides running in its plane. These waveguides are then fanned out and interfaced to using a standard connector, such as AMP's LightRay™ MPX system, to an array of fibers. If power control is required, as it is when the link is to be high speed and eye-safe, the only alternative prior to the present invention was to use an array of individual VCSELs, each packaged in a TO can with a semireflective window and a backreflection optical power monitor. Besides the massive cost increase over a solution based on embodiments of the solution proposed above as enabled by the present invention, the space requirement is enormous by comparison, drastically reducing applicability in real-world systems. A practical implementation of this system using the present invention is depicted in FIG. 36. Finally, the present invention can be used with many emerging and future technologies. An integrated power monitoring solution for one of these—coarse wave division multiplexing—is shown in FIG. 37. In this system, VCSEL arrays in which VCSELs are tuned to different wavelengths or are tunable during operation, are used to send signals of multiple wavelengths over a single waveguide. Light emitted from the flipped VCSEL array is directed through the semitransparent PIN detector array into the waveguide plane, and subsequently to merge the individual waveguides, and thereby wavelengths, into a single channel using an integrated wavelength multiplexer structure. This format, and many other systems that are proposed or under development, stand to gain significantly from embodiments of the present invention through its ability to reduce costs, package size, and complexity while enhancing switching speeds and eye safety.

The present invention has now been described in connection with a number of specific embodiments thereof. However, numerous modifications, which are contemplated as falling within the scope of the present invention, should now be apparent to those skilled in the art. Therefore, it is intended that the scope of the present invention be limited only by the scope of the claims appended hereto.

What is claimed is:

1. A semitransparent optical detector comprising:
   a semitransparent PIN diode having at least one polycrystalline semiconductor layer, wherein the polycrystalline semiconductor is a polycrystalline alloy of silicon and germanium.

2. The detector of claim 1, wherein the polycrystalline alloy is microcrystalline.

3. The detector of claim 1, wherein the PIN diode has another layer of at least one of an amorphous semiconductor and a microcrystalline semiconductor.

4. The detector of claim 1, further comprising:
a transparent substrate upon which the PIN diode is disposed.

5. The detector of claim 4, further comprising:
a transparent conductor disposed on a surface of the PIN diode.

6. A semitransparent optical detector comprising:
a PIN diode having amorphous silicon P and N layers; and
an intrinsic I layer of an alloy of silicon and germanium.

7. The detector of claim 6 on a transparent substrate.

8. The detector of claim 7 wherein the substrate is glass.

9. The detector of claim 7 wherein the substrate is a polymer.

10. The detector of claim 7 wherein the substrate is silicon which is transparent at a wavelength greater than about 1100 nm.

11. The detector of claim 6, wherein the concentration of germanium in the I layer is graded from a relatively low concentration adjacent the P and N layers to a relatively high concentration in the interior of the I layer.

12. A semitransparent optical detector comprising:
a thin film PIN diode which both detects and is semitransparent to light having a wavelength λ;
a first conductor at least partly covering and contacting a first surface of the PIN diode, the first conductor being semitransparent to light having the wavelength λ;
a second conductor at least partly covering and contacting a second surface of the PIN diode, the second surface being opposite the first surface and also being semitransparent to light having the wavelength λ; and
a passivation layer coveting and enclosing all edges of the PIN diode, defining an aperture exposing at least a portion of the first surface of the PIN diode, and exposing a part of the second semitransparent conductor for contact thereto.

13. The detector of claim 12, the passivation layer having a hole defined therethrough, through which contact is made with the second semitransparent conductor.

14. The detector of claim 12, further comprising:
a patterned metal layer over the passivation layer, including a first conductor entering the aperture to contact the first semitransparent conductor and a second conductor contacting the second semitransparent conductor.

15. The detector of claim 14, wherein the second conductor contacts the second semitransparent conductor through a hole defined in the passivation layer.

16. The detector of claim 12, wherein the passivation layer is silicon nitride.

17. The detector of claim 12, wherein the passivation layer is silicon dioxide.

18. The detector of claim 12, wherein the first transparent conductor extends partly over the passivation layer, the detector further comprising:
a patterned metal layer over the passivation layer, including a first conductor contacting the first transparent conductor without entering the aperture and a second conductor contacting the second transparent conductor.

19. A semitransparent optical detector comprising:
a thin film PIN diode;
a first transparent conductor at least partly covering and contacting a first surface of the PIN diode;
a second transparent conductor at least partly covering and contacting a second surface of the PIN diode;
a passivation layer covering and enclosing all edges of the PIN diode, defining an aperture on one surface thereof, and exposing a part of the second transparent conductor for contact thereto, wherein the first transparent conductor extends partly over the passivation layer; and
a patterned metal layer over the passivation layer, including a first conductor contacting the first transparent conductor without entering the aperture and a second conductor contacting the second transparent conductor.

20. The detector of claim 19, wherein the second conductor contacts the second transparent conductor through a hole defined in the passivation layer.

21. The detector of claims 14 or 19, wherein the thin film PIN diode extends to a contact pad position and the first conductor defines a path on the surface of the PIN diode to the contact pad position.

22. The detector of claim 21, wherein a region contacted by at least one of the first and second transparent conductors defines a limited active area less than all of the PIN diode.

23. The detector of claims 14 or 19, wherein the PIN diode has tapered edges, a top surface of the PIN diode having a smaller area than a bottom surface thereof.

24. A small aperture semitransparent optical detector comprising:
a first conductive layer;
a PIN diode which is semitransparent to and detects light of wavelength λ;
a passivation layer covering and enclosing all edges of the PIN diode and defining an aperture exposing an upper surface of the PIN diode, wherein the first conductive layer extends partially under the PIN diode and electrically contacts a bottom surface of the PIN diode leaving unobstructed a portion of the bottom surface directly opposite the aperture so that light can pass through the aperture into the diode and out of the bottom surface without being obstructed by the first conductive layer; and
a second conductive layer contacting the surface of the PIN diode through the aperture.

25. The detector of claim 24, wherein the second conductive layer covers the aperture and is a transparent to light of wavelength λ, the detector further comprising:
a third conductive layer contacting the second conductive layer outside the aperture.

26. The detector of claim 24, wherein the first conductive layer extends under the PIN diode on only one side and the second conductive layer contacts the exposed surface of the PIN diode in an area that is generally diagonally opposite where the first conductive layer extends under the PIN diode.

27. The detector of claim 24, wherein the first side of the PIN diode is one of the p-doped side and the n-doped side of the PIN diode and the exposed surface is of the other of the p-doped side and the n-doped side of the PIN diode.

28. The detector of claim 24, further comprising a substrate onto which the first conductive layer is formed, wherein the substrate is transparent to light of wavelength λ, the first conductive layer defines an open area which exposes the underlying substrate, and the PIN diode is formed on the substrate in the open area and partially extending onto the first conductive layer.

* * * * *